United States Patent
Dupont

(10) Patent No.: US 10,462,789 B1
(45) Date of Patent: *Oct. 29, 2019

(54) VARIABLE FREQUENCY DATA TRANSMISSION

(71) Applicant: CYBORG INC., New York, NY (US)

(72) Inventor: Nicolas Thomas Mathieu Dupont, Montverde, FL (US)

(73) Assignee: Cyborg Inc., Montverde, FL (US)

( * ) Notice: Subject to any disclaimer, the term of this patent is extended or adjusted under 35 U.S.C. 154(b) by 46 days.

This patent is subject to a terminal disclaimer.

(21) Appl. No.: 15/817,945

(22) Filed: Nov. 20, 2017

Related U.S. Application Data

(63) Continuation of application No. 14/846,424, filed on Sep. 4, 2015, now Pat. No. 10,028,277, which is a continuation-in-part of application No. 14/583,890, filed on Dec. 29, 2014, now abandoned, which is a continuation of application No. 14/085,717, filed on Nov. 20, 2013, now Pat. No. 8,941,513.

(51) Int. Cl.
- *H04W 72/04* (2009.01)
- *H03M 7/30* (2006.01)
- *H04B 1/40* (2015.01)

(52) U.S. Cl.
CPC ......... *H04W 72/0453* (2013.01); *H03M 7/30* (2013.01); *H03M 7/6088* (2013.01); *H04B 1/40* (2013.01)

(58) Field of Classification Search
None
See application file for complete search history.

(56) References Cited

U.S. PATENT DOCUMENTS

| | | | |
|---|---|---|---|
| 4,023,887 A | 5/1977 | Speers | |
| 4,107,517 A | 8/1978 | Cooper | |
| 4,490,797 A | 12/1984 | Staggs et al. | |

(Continued)

FOREIGN PATENT DOCUMENTS

| | | |
|---|---|---|
| WO | WO 2000/004681 | 1/2000 |
| WO | WO 2006/080031 | 8/2006 |
| WO | WO 2015/077060 | 5/2015 |

OTHER PUBLICATIONS

Office Action for U.S. Appl. No. 14/085,717, dated Jul. 30, 2014, 5 pages.

(Continued)

*Primary Examiner* — Kevin D Mew

(57) ABSTRACT

A system is disclosed comprising a transceiver, transcoder, memory, and a processor for receiving raw data, partitioning the raw data into substrings of predetermined length, assigning each substring to a corresponding predetermined frequency based upon a data set or first lookup table based on the substring's given pattern, and transmitting said frequency using an antenna. Embodiments include a compression component for receiving raw data as input, breaking the raw data into subsets of predetermined length, comparing the raw data to a second lookup table, the second lookup table comprising all possible bit patterns for a file of the length of the raw data, wherein the possible bit patterns are partitioned in n-bit partitions, the n-bit partitions having a corresponding assigned value, the values of which are assembled by a given function so as to produce a code for each possible bit pattern.

14 Claims, 24 Drawing Sheets

(56) References Cited

U.S. PATENT DOCUMENTS

| | | | |
|---|---|---|---|
| 4,908,779 | A | 3/1990 | Iwata |
| 5,081,528 | A | 1/1992 | Hayashi et al. |
| 5,442,350 | A | 8/1995 | Iyer et al. |
| 5,633,631 | A | 5/1997 | Teckman |
| 5,691,827 | A | 11/1997 | Kamei et al. |
| 5,781,540 | A | 7/1998 | Malcolm et al. |
| 5,983,289 | A | 11/1999 | Ishikawa et al. |
| 6,288,742 | B1 | 9/2001 | Ansari et al. |
| 6,353,908 | B1 | 3/2002 | Heinrich |
| 6,548,967 | B1 | 4/2003 | Dowling et al. |
| 6,563,442 | B1 | 5/2003 | Luna et al. |
| 6,807,372 | B1 | 10/2004 | Lee et al. |
| 6,956,511 | B2 | 10/2005 | Thomas et al. |
| 6,987,468 | B1 | 1/2006 | Malvar |
| 7,505,624 | B2 | 3/2009 | Ogden et al. |
| 8,009,325 | B1 | 8/2011 | Borg et al. |
| 8,463,944 | B2 | 6/2013 | Bansal et al. |
| 8,607,372 | B2 | 12/2013 | Hall |
| 8,610,605 | B2 | 12/2013 | Froemmgen |
| 8,904,181 | B1 | 12/2014 | Felsher et al. |
| 8,941,513 | B1 * | 1/2015 | Dupont ............... H03M 7/6088 341/50 |
| 8,949,466 | B1 | 2/2015 | Crosbie et al. |
| 9,572,159 | B2 * | 2/2017 | Nogami ................ H04W 28/18 |
| 2001/0024302 | A1 | 9/2001 | Fujita |
| 2002/0035685 | A1 | 3/2002 | Ono et al. |
| 2004/0257988 | A1 | 12/2004 | Evans et al. |
| 2007/0195840 | A1 | 8/2007 | Hosking |
| 2007/0300290 | A1 | 12/2007 | Shay |
| 2008/0102860 | A1 | 5/2008 | Ignatius et al. |
| 2008/0122723 | A1 | 5/2008 | Rofougaran |
| 2008/0253766 | A1 | 10/2008 | Huinan et al. |
| 2008/0272939 | A1 | 11/2008 | Cameron |
| 2010/0003032 | A1 | 1/2010 | Houle et al. |
| 2010/0124272 | A1 | 5/2010 | Fein et al. |
| 2010/0177899 | A1 | 7/2010 | Bucklin et al. |
| 2011/0010563 | A1 | 1/2011 | Lee et al. |
| 2011/0091153 | A1 | 4/2011 | Dahlfort et al. |
| 2011/0261677 | A1 * | 10/2011 | Kim ...................... H04L 5/003 370/210 |
| 2011/0286440 | A1 * | 11/2011 | Chung ............. H04W 72/0446 370/342 |
| 2012/0063766 | A1 | 3/2012 | Matsukawa et al. |
| 2012/0082469 | A1 | 4/2012 | Xia et al. |
| 2012/0144148 | A1 | 6/2012 | Seo et al. |
| 2012/0176884 | A1 * | 7/2012 | Zhang .................. H04B 7/024 370/203 |
| 2012/0218314 | A1 | 8/2012 | Purdy et al. |
| 2013/0007239 | A1 | 1/2013 | Agarwal et al. |
| 2013/0088949 | A1 * | 4/2013 | Zhang .................. H04L 5/0007 370/208 |
| 2013/0128832 | A1 * | 5/2013 | Kang .................. H04W 72/042 370/329 |
| 2013/0181851 | A1 | 7/2013 | Kataoka |
| 2013/0219070 | A1 | 8/2013 | Kramarenko et al. |
| 2013/0223542 | A1 | 8/2013 | Kim et al. |
| 2013/0343318 | A1 * | 12/2013 | Gruet ..................... H04L 5/001 370/329 |
| 2014/0072064 | A1 | 3/2014 | Lemson et al. |
| 2014/0145866 | A1 | 5/2014 | Lee et al. |
| 2014/0233945 | A1 | 8/2014 | Jeong et al. |
| 2014/0270796 | A1 | 9/2014 | Jovicic et al. |
| 2014/0341589 | A1 | 11/2014 | Schmid et al. |
| 2014/0375217 | A1 | 12/2014 | Feri et al. |
| 2015/0082018 | A1 | 3/2015 | Landais |
| 2015/0104184 | A1 | 4/2015 | Jeffrey |
| 2015/0155937 | A1 | 6/2015 | Jeffrey |
| 2015/0155938 | A1 | 6/2015 | Jeffrey |
| 2015/0280740 | A1 | 10/2015 | Cho et al. |
| 2015/0303940 | A1 | 10/2015 | Dupont |
| 2015/0382352 | A1 | 12/2015 | Dupont |
| 2016/0241323 | A1 | 8/2016 | Ko et al. |
| 2016/0285505 | A1 | 9/2016 | Lee et al. |
| 2016/0329999 | A1 * | 11/2016 | Li ......................... H04L 5/0007 |
| 2017/0214500 | A1 * | 7/2017 | Hreha .................. H04L 5/0023 |
| 2018/0160329 | A1 * | 6/2018 | Golitschek Edler von Elbwart ................ H04L 1/0026 |
| 2018/0220404 | A1 * | 8/2018 | Awad .................. H04W 72/042 |
| 2018/0359760 | A1 * | 12/2018 | Su ....................... H04W 72/082 |

OTHER PUBLICATIONS

Office Action for U.S. Appl. No. 14/583,890, dated Aug. 25, 2015, 4 pages.
Office Action for U.S. Appl. No. 14/846,424, dated Nov. 29, 2017, 4 pages.
Office Action for U.S. Appl. No. 14/846,424, dated Jan. 13, 2017, 4 pages.
Office Action for U.S. Appl. No. 14/846,424, dated Aug. 23, 2017, 5 pages.
International Search Report and Written Opinion for International Application No. PCT/US2014/064914, dated Oct. 8, 2015, 6 pages.
International Search Report and Written Opinion for International Application No. PCT/US2014/064710, dated Mar. 13, 2015, 9 pages.
International Search Report and Written Opinion for International Application No. PCT/US2014/064907, dated Feb. 23, 2015, 7 pages.
International Search Report and Written Opinion for International Application No. PCT/US2014/064709, dated Apr. 29, 2015, 7 pages.

* cited by examiner

Figure 8

| Binary String | R | G | B |
|---|---|---|---|
| 1111111100000000000000000 | 255 | 0 | 0 |
| 0110011001100110011111111 | 102 | 102 | 255 |
| 0011001110011001100011001 | 51 | 204 | 153 |
| 1111111111111111101100110 | 255 | 255 | 102 |
| 1111111100000000011001100 | 255 | 0 | 204 |
| 0011001110011001101111111 | 51 | 204 | 255 |
| 0011001100110011000000000 | 51 | 51 | 0 |
| 0011001100110011001100110 | 51 | 51 | 153 |
| 1111111100110011001100110 | 255 | 153 | 153 |

Figure 20

| Column A | Column B | Column C | Column D |
|---|---|---|---|
| Original (8 bit example, 256 possible combinations) | Packaged | Coefficient | Value |
| 00000000 | 00.00.00.00 | 0000 | 1 |
| 00000001 | 00.00.00.01 | 0001 | 2 |
| 00000010 | 00.00.00.10 | 0002 | 3 |
| 00000011 | 00.00.00.11 | 0003 | 4 |
| 00000100 | 00.00.01.00 | 0010 | 5 |
| 00000101 | 00.00.01.01 | 0011 | 6 |
| 00000110 | 00.00.01.10 | 0012 | 7 |
| 00000111 | 00.00.01.11 | 0013 | 8 |
| 00001000 | 00.00.10.00 | 0020 | 9 |
| ...through pattern 256 | ... | ... | ... |

VARIABLE FREQUENCY DATA TRANSMISSION

CROSS REFERENCE TO RELATED APPLICATION(S)

This application is a continuation of U.S. application Ser. No. 14/846,424 filed Sep. 4, 2015, which is a Continuation-In-Part of U.S. application Ser. No. 14/583,890 filed Dec. 29, 2014, which is a continuation of U.S. application Ser. No. 14/085,717 filed on Nov. 20, 2013, now U.S. Pat. No. 8,941,513 issued Jan. 27, 2015, which are herein incorporated by reference in their entirety.

FIELD OF THE INVENTION

The present invention relates generally to the field of devices for transmitting and receiving data.

COPYRIGHT

Copyright—A portion of the disclosure of this document contains material that is subject to copyright protection. The copyright owner has no objection to the facsimile reproduction by anyone of the patent document or the patent disclosure, as it appears in publically available Patent and Trademark Office patent files or records, but otherwise reserves all copyright rights whatsoever. The following notice applies to the software, data, and/or screenshots which may be described below and in the drawings that form a part of this document: Copyright Nicolas T. M. Dupont, All Rights Reserved.

BACKGROUND

Data is transmitted wirelessly every day. For example, a laptop may be wirelessly connected to a router which is in turn connected to a physical fiber. An end user sending an email may transmit the email wirelessly to the router, where it is then transferred to a filer for transmission to its final destination.

Most current wireless networks are based on various governed standards, including and not limited to, 802.11 (IEEE), LTE (ITU-R), and HSPA (3GPP). The current standard for wireless transfer of data is the 802.11 ac standard which allows for a transfer speed of 1.75 GBits per second. This technology, like other radio-based technology uses a basic on/off binary transfer system.

One limitation of the binary system for the transmission of data is that there is a physical limitation to the transfer speed. For example, because binary is a series of bits represented as zeroes and ones, effective transfer speed requires billions of 0/1 bits per second. It is not possible to get any greater throughput in current technology. Improvements in the area of data transmission focus on further increasing throughput as opposed to improving the efficiency of binary itself. There are currently no viable alternatives to binary transfer, and as a result, binary is ubiquitously employed.

In wireless data transmission, antennae are necessary to receive data. Antennas function by transmitting or receiving electromagnetic waves. An antennae is an electrical conductor assembled together with a power supply to increase the impedance in the antennae, causing metal conductors within to oscillate in a certain way that creates a radio frequency. By way of example, if a user wished to listen to FM radio, for example, channel 107.7, the antennae can be dialed to receive a frequency corresponding to the station number (107.7 MHz). Although the antenna can receive and is exposed to many frequencies of FM stations, in a radio, the user dials into one frequency to listen to the radio station on that frequency.

There is currently no system that uses variable frequencies to send the same data. As of the filing of this patent application, one of the fastest wireless transfers systems is millimeter-band wireless, which allows for up to a couple billion GB/sec. The technology uses a different frequency band, but only one frequency (presently around 60 GHz). There are also no viable alternatives to binary transfer, and as a result, binary is ubiquitously employed.

In addition, there are currently no systems which can compress a data file, regardless of its type. Current methods for data compression require knowledge of the information contained in a data file in order to remove redundancy in the data file. Compression schemes such as the zip format creates codecs which work on the application layer, not the physical layer (pure binary). For instance, a certain pixel or character (8 bit character, such as the letter "A") can be given a code in arithmetic coding schemes such that the file can be compressed by replacing codes for certain characters or file parts. This is why there are various compression schemes for differing file types—because current compression systems require knowledge of the file's components in order to determine what will be redundant in the file (and therefore eliminated such that a compressed file can be generated). As a result, these systems can be very complex.

For instance, incoming binary code for an image is translated such that it is seen as an image with characteristics, such as pixels. After this interpretation, current compression schemes then operate on the file or folder. Previous compression systems will work, for example, by removing certain pixels and adding more noise to the image or overall quality of the image. Then, the processed image is assigned a new string of binary code, which is considered the compressed file. Compression of images or videos by these schemes can require complex algorithms and systems for determining which pixels may be redundant and therefore "eliminated" in a compressed file. Or, for example Huffman coding can be used to compress a text file, among other file types. The premise of this coding is that characters which repeat most often (for instance a space) are assigned a much shorter code of bits, so that when translated for transmission, the whole file is much shorter. Basically, the way these systems work is that they require knowledge of what the raw data stands for in order to decide what can be removed from a file for the purpose of compression.

Knowledge of data content for compression is seen in image compression, for example, when data is analyzed for statistical redundancy. For example, an image may have areas of color that do not change over several pixels; instead of coding each individual repeated pixel, the data may be encoded as "X number of red pixels." Because a pixel is 16 bits, the analysis of the redundant pixels must therefore occur on the application layer, so to speak. Similarly, in the case of video, current compression schemes will see a video file and what it stands for. These compression systems may take into account such things as image quality and video size. Regarding the determination of statistical redundancy above, probability tables are sometimes used for the purpose of analyzing the probability that bit sequences down the string of a binary code may stand for something, for instance a pixel or certain character. There are several examples, but one is the use of probability schemes to determine if there is a high chance a certain upcoming byte (8 bit bit-pattern) will stand for something redundant, for example, the character (a byte) may be removed (or, in the case of an image pixel, a 16 bit section may be removed). Then this analyzed data may then be compressed so that redundant bytes are removed (or in the case of when an image pixel removed, a two byte string is removed) and then a new binary string is assigned to represent the original file. This new binary string is the compressed file which is transmitted. The probability schemes aim to ensure that the compressed file may be decompressed such that it is a close approximation of the original.

In the above example, the statistical apparatus of these systems are based solely on the type of data to be compressed, i.e., video or audio. Current compression systems do not operate on raw binary to compress simply a string of zeroes and ones. Instead, as alluded to above, these systems require an analysis of what the binary represents (the "data") in order to compress the raw data (ex. the raw binary behind the data, and in other words operating from the standpoint of the application layer). The JPEG scheme, for example, does not simply take out zeroes and ones from the image's original binary code irrespective of what that bit might stand for.

Because different data types will have different properties in terms of what will be statistically redundant, current compression schemes are different for different data types. Images, text, audio or video will have different properties. For instance, while spaces may be most prevalent in a given text, certain colors might be most prevalent in an image. Therefore, those redundancies are handled differently based on the data type. Also, what is removed from a given original file is removed only after intelligent, and many times complex, analysis of redundancy in the original data.

The background description provided herein is for the purpose of generally presenting the context of the disclosure. To the extent that work of the inventor hereof is described in this background section, as well as aspects of the invention that may not otherwise qualify as prior art at the time of filing, they are neither expressly nor impliedly admitted as prior art against the present disclosure.

SUMMARY

Methods, systems, and apparatus, including computer program products (referred to collectively for convenience as the "system") are disclosed for a wireless data transmission system which partitions data to be transmitted into partitions wherein each partition is assigned a predetermined frequency based on the partition's pattern. A transcoder may perform the partitioning and assigns each partition the predetermined frequency. A transceiver effectuates a conversion of the assigned predetermined frequency into to electrical pulses needed for the generation of actual predetermined frequencies, which are then emitted by at least one antennae. In one embodiment described in more detail below, the system assigns the predetermined frequencies to partitions in accordance with a color model. In another embodiment, the system comprises a variable frequency data transmission system coupled with a data compression component comprising the data compression system method disclosed in related U.S. Pat. No. 9,124,295 the content of which is incorporated by reference. In the embodiment which includes a data compression component, data to be transmitted is first compressed using the data compression component. Then, data (which has been compressed) is partitioned into partitions, wherein each partition has a predetermined frequency. The partition may then be converted to electrical pulses by a transceiver or a frequency control for the generation of frequencies to be emitted by at least one antenna.

The transcoder of the device may have both encoding and decoding ability. Encoding as used herein refers to the assignment of predetermined frequencies to the packets (also referred to herein as partitions, each term generally referring to a section of an overall whole). Decoding refers to receiving predetermined frequencies and regenerating the original corresponding partition(s). To that end, another embodiment of the above further includes a receiving terminal (a "second terminal") comprising a least a decoding device or transcoder having decoding ability. The decoding device preferably comprises a computerized device further comprising at least one antenna for receiving the variable frequencies, a decoder for converting the frequencies back to their corresponding partitions, and recombining the partitions to generate the original data. In the embodiment where the data set used to assign a particular predetermined frequency to a particular partition is the RGB code, first the decoding device or transcoder receives frequencies, converts those frequencies to their corresponding pattern in accordance with RGB code, and then combining the various bit patterns of the RGB code corresponding to each frequency into a binary string. This binary string would be the original data in embodiments where the data comprises binary data. In the embodiment of a system comprising the data compression system, a parallel data compression component for performing a parallel decompression of the binary string occurs in order to generate the original data. This file may then be released for reading or translation by the operating system of the computerized device and may be displayed on a display for viewing by a user.

Part of this disclosure is the recognition that a Red Green Blue (RGB) spectrum of 255 shades of each main color allows for 16,777,216 colors and that all or a portion of this wide range of colors may be harnessed for use in data transmission. As described in the Detailed Description, this is done by recasting any binary string as RGB code and transmitting the RGB code, in variable frequencies.

This patent application discloses the system's data transfer aspect, input encoding/decoding, physical transfer, and variations thereto within the scope of this disclosure.

The disclosed system attacks the problem of transfer speed at its source (ex. limitations on traditional binary transmission) in addition to improving transfer speed. The preferred embodiment comprises at least one transmitting terminal or receiving terminal, or both, or a plurality of both, in communication with at least one fiber. The transmitting terminal and the receiving terminal further comprise a computerized device for communicating with a frequency controller and antenna for wireless data transmission. The computerized device in the preferred embodiment further comprises at least an encoding device for converting binary code into RGB code, a frequency controller for converting the RGB code into simple electrical pulses, and an antenna for emitting the pulses as variable frequencies. In another embodiment, the system also includes a parallel decoding device serving as the receiving terminal. In yet another embodiment, the system may comprise a plurality of computerized devices, connected by at least one wireless communication channel, having an encoding device or decoding device, or both, for transmitting and receiving the data which has been coded/decoded as RGB code, respectively.

One aspect of this disclosure is a method and system for improving the ability of an antenna (such as but not limited to those shown in FIG. 1) to handle more data than previously possible. This is done through the unique method for transmitting data in variable frequencies.

In another embodiment, the system comprises at least an encoding device comprising at least one antennae coupled with a circuit board (device PCB) and also having at least a processor, input/output, antennae output, memory and storage. The PCB may further comprise at least one encoding chip and at least one decoding chip. In this embodiment, the system further comprises at least one processor, storage, memory and input/output, together in communication via system bus, and the PCB housing an encoder (also referred to herein as an encoding chip) in communication with a frequency controller and antenna for transmitting variable frequencies. At the encoding chip, binary code (which may be binary code previously compressed) is broken into 24 bit packets. Each 24 bit packet has a corresponding code in the 24-bit RGB color model. The color code in the RGB model is assigned to each 24 bit packet in the binary string. The encoding chip then accesses a lookup table. The loopkup table preferably comprises each color code in the model selected (24 bit RGB in the preferred embodiment) and a corresponding predetermined frequency. The frequencies assigned to each RGB code may vary based on frequencies and standards used for wireless transmission. However, in the preferred embodiment, for each of the 16,777,216 color codes in the 24 bit RGB color model, the predetermined frequencies are in 5 Hz increments anywhere in the Wi-Fi range (2.5 MHz to 5 GHz). The increments may be varied. For instance, 1 Hz increments could be used, and frequencies assigned may be 2.40000000 Hz to 2.416777216 Hz.

Once the 24 bit packets are assigned their predetermined frequency, a frequency control, which may be a frequency control available commercially, then transmits the frequency to be emitted as simple electrical pulses to direct at least one antenna to oscillate at the given frequency.

For receiving data transmitted by the encoding device at a receiving terminal, the system comprises a receiving antenna for receiving the frequencies generated by the transmitting antenna coupled with a decoding chip (also referred to as "decoder"). Once the data has been emitted by the transmitting antenna of the transmitting terminal, it may be received by an antenna on the receiving terminal, the receiving terminal in communication with the random access memory (RAM) of the computerized device comprising the receiving terminal in order to be processed by the decoder, also housed on the receiving terminal. The decoder regenerates the binary string by decoding the RGB colors back into their corresponding 24 bit binary pattern and reassembling the binary string for output to a CPU, for example. If the binary string which was encoded represents a compressed file, the regenerated binary string would be decompressed by the receiving terminal as well. Preferably, both receiving and transmitting terminals comprise at least an encoder and decoder enabling both the transmittal and receipt of data handled as disclosed herein.

The receiving terminal may be another computing device, similarly outfitted with a decoding device comprising or coupled with at least one antenna for decoding the variable frequencies back into their corresponding RGB code (by accessing the same lookup table used in the transmitted terminals encoding device) and the RGB codes converted back to their corresponding 24 bit strings, which may be reassembled into a single binary string. This binary string may further be decompressed (if compressed at the transmitting terminal). From there, the operating system of the receiving device may read or use the binary string for its intended purpose.

If this method occurs within a computerized device such as a tablet, the variable frequencies may be received by an antenna at a router. The router is similarly outfitted with a parallel decoding chip capable of decoding each frequency received back into the corresponding RGB code. The RGB codes then maybe converted back into the 24 bit binary and reassembled for transmission as binary through a fiber (such as an Ethernet cable connected to a network of underground optical fibers), or the RGB code may be converted into its corresponding color wavelengths and transmitted in accordance with the system and method disclosed by U.S. patent application Ser. No. 14/080,512 to Nicolas T. M. Dupont. Alternatively, the binary may be transmitted using traditional on/off flashes through the fiber to its final destination.

Because of the data transmitted is in variable frequencies, each frequency pertaining to various colors of the color model used (preferably RGB), the system differs from traditional binary transmission where one data stream is sent in one frequency in on/off flashes representing binary zeroes and ones. However, because the system permits decoding of binary into RGB code, the system is interoperable with binary. This is advantageous as the binary system is ubiquitously employed and interoperability enables the use of the system in conjunction with existing systems.

In another embodiment, and as mentioned above, one or a plurality of computerized devices may further include a data compression component comprising the data compression system disclosed in U.S. patent application Ser. No. 14/080,248 filed Nov. 14, 2013, to Nicolas T. M. Dupont, the content of which is incorporated below beginning at paragraph 92 below. In this embodiment, this data compression component may be coupled to the encoder and decoder of the present system, respectively, and serves to compress data prior to conversion to RGB code (also at the encoder) and decompress data after de-conversion from RGB code to binary (also at the decoder). The system may also receive data compressed via other schemes. The preferred embodiment of the system comprises a decoding device or encoding device, or both in communication, where the encoding device and decoding device include architecture for performing the methods described herein. The encoding device preferably comprises at least a processor, storage, memory, and a chip upon which firmware is embodied to perform the compression method, the method comprising packaging binary data in two bit packets and performing, either simultaneously or following packaging, pattern recognition on the binary data for comparison with pre-generated compression key tables, where the pre-generated compression key tables are generated also using the two bit packaging scheme. In the embodiment comprising both an encoding and decoding device in communication, the decoding device has a parallel architecture as the encoding device. Communication between an encoding device and the decoding device may be wireless data transfer as well as transfer through a physical connection, such as an optical fiber.

As described in detail in the Detailed Description (the content of which is considered part of this Summary), for a given file to be compressed, it is compared to a preferably self-generating table to compare its bit pattern, in two bit packets, to its corresponding compression key. From there, the compression key is used to call a value representing a shorter code for the original file. This value is then recast as a new, compressed string of binary code. In contrast to the methods presented in the Background above, the present system's combination and implementation of data packaging techniques, pattern recognition, and compression key generation/use allows for a file's binary code to be compressed regardless of data type (data "type" could be for example, text file, video, audio, image, etc.) and regardless of the arrangement of the binary code. The system takes into account the untranslated binary code, regardless of what the binary stands for.

In one embodiment, the system comprises firmware embodied on a chip which operates to compress any raw data, such as binary code, and substitute a smaller size code to stand for the original raw data. The compressed raw data is then transmitted by the transmitting terminal (via frequencies emitted by an antenna) to a receiving terminal. When the compressed data arrives at the receiving terminal, it is decoded (preferably using corresponding chips/firmware which are loaded on the receiving terminal) back into its original form. From there, the terminal's operating system decodes the compressed data into its original data form (in other words, back to the file), to be read and utilized by various applications.

Variations are contemplated and made part of this summary as detailed in the Detailed Description. These include but are not limited to the use of data sets of other than the RGB data set for assigning a particular unique frequency to a given partition, or using data sets that are not color codes. A transcoder and transceiver may be utilized in lieu of an encoding/decoding device and router, respectively, and multiple bands may be used such that the system can receive and transmit data by other known means as well as data transmitted using the disclosed schema. The compression system may be coupled with the transceiver/transcoder embodiment and may break the raw data into subsets of predetermined length, compare the raw data to a second lookup table, the second lookup table comprising all possible bit patterns for a file of the length of the raw data, wherein the possible bit patterns are partitioned in n-bit partitions, the n-bit partitions having a corresponding assigned value, the values of which are assembled by a given function so as to produce a code for each possible bit pattern.

Other hardware configurations for converting raw data to a code and transmitting the same over a wireless network are also contemplated. One more antennas may be used, with variable power and sensitivities. Other variations known to those skilled in the art are deemed within the scope of this disclosure.

BRIEF DESCRIPTION OF THE DRAWINGS

FIG. 8 shows a sampling of 24 bit bit-patterns and their corresponding code in the RGB color model.

FIG. 20 shows an exemplar assignment of a coefficient to each two-bit packets and the subsequent assignment of a second value to the coefficient string in accordance with an embodiment of the data compression component.

DETAILED DESCRIPTION

Figure 1:
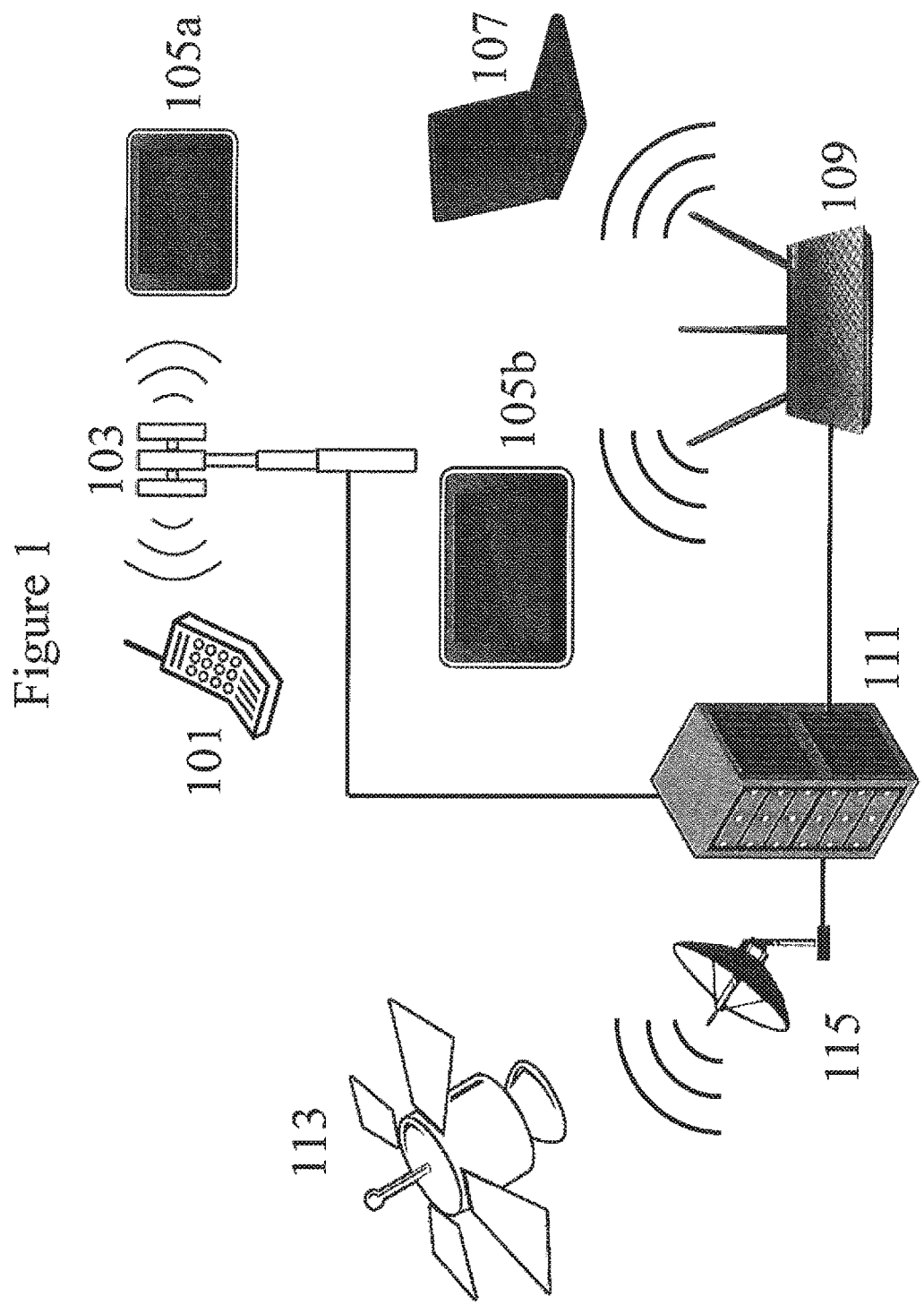
FIG. 1 shows various devices communicating wirelessly and through physical fibers.

An apparatus, system, and method is disclosed for transmitting data using variable colors (referred to collectively as the "system" for convenience). FIG. 1 shows wireless communication between various devices and various receivers in many contexts. For example, a mobile phone 101 communicating with a cell phone tower 103, a tablet 105(*a*), 105(*c*) communicating with cell phone tower 103 (and tablet 105*b* communicating with the cell phone tower 103), PC 107 communicating with a router 109, and a server 111 communicating with a satellite 113. FIG. 1 shows a server 111 hardwired to a router 109 then wirelessly connected to devices 105*b* (a tablet) and laptop 107. Hardwire (such as a fiber) connects the router 109 to the server 111, the sever 111 to the satellite dish 115, and cell phone tower 103 to the server 111.

One aspect of this disclosure is a method and system for improving the ability of antennae located on the various receivers (such as but not limited to those shown in FIG. 1)

to handle more data than previously possible. This is done through the unique method for transmitting data described further below.

Figure 2:
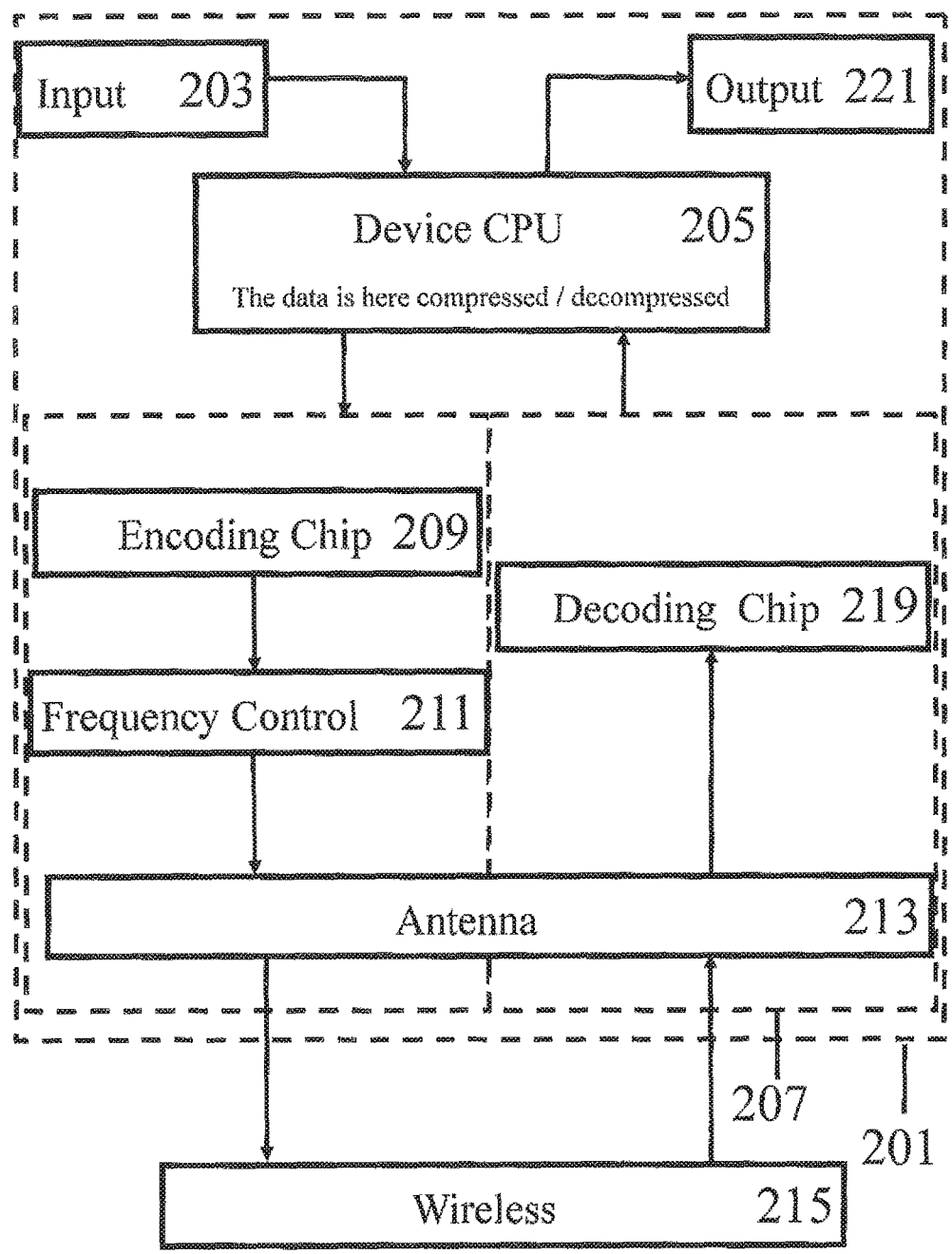
FIG. 2 shows an embodiment of the system for transmitting and receiving data wirelessly using variable frequencies.

FIG. 2 shows an embodiment of the hardware components of the system as embodied on one of the devices set forth in FIG. 1. FIG. 2 shows a close-up of one of the devices 201 having Input 203 for receiving data. Input 203 is data received from any data source which may be in binary format. Data can come from the internet, a disk, a USB key, etc. Input 203 is transmitted to a Device CPU 205, the processor of which is described in more detail later in this disclosure. Data is preferably data compressed by CPU 205 in conjunction with other componentry described in and in accordance with the system and method disclosed in related U.S. patent application Ser. No. 14/080,248, the disclosure of which is incorporated below. The device housing the device CPU 205 may be a computer, a mobile phone, or any other hardware capable of receiving data and containing a CPU.

In one embodiment, device CPU 205 communicates with components housed on a Printed Circuit Board ("PCB") 207. The PCB comprises at least one Encoder 209 (also referred to as the "Encoding Chip") where data is encoded from binary format into RGB format. (See, for example, FIG. 8, showing a selection of 24 bit binary patterns and the corresponding RGB code). RGB format refers to Red Green Blue format, which holds an array of 255 shades of each of these three primary colors. The Encoding Chip 209 then passes data (now in RGB format) to a frequency controller 211. The frequency controller 211 is a controller for encoding RGB code into simple electrical pulses (the manner in which is described below) and may be a commercially available RGB frequency controller.

This process of encoding the RGB data comprises accessing a lookup table for comparing a particular RGB code with a particular predetermined frequency corresponding to the particular color code in the color model used. As mentioned, the preferred embodiment uses 24-bit RGB code, which has 16,777,216 individual color codes possible. In this case, there would need to be 16,777,216 individual frequencies assigned to each color code.

The frequency assigned to a particular code in RGB code may be any frequency and chosen based on a number of factors, such as IEEE standards and governmental regulatory standards. For example, the Wi-Fi standard employs a frequency band between 2.5 GHz and 5 GHz. Because there are 16,777,216 possible colors in the 24-bit RGB color scheme (the preferred color scheme for use with the system), the system will require 16,777,216 different individual frequencies within the Wi-Fi band for use to assign to each RGB color code. One embodiment could use increments of a single hertz of frequency between each frequency. In other words, for RGB Color Codes 1-16,777,216, the corresponding frequencies in the Wi-Fi band range could be from 2.400000000 MHz through 2.416777216 MHz, in 1 Hz increments. This configuration is possible with the aid of programming known in the art for reducing noise or fluctuations (caused by, for example a wave at a particular frequency changing frequencies due to outside interference, such as atmospheric conditions, altering the wave slightly).

An embodiment, however, may space each frequency assigned to a particular RGB color code in increments of 5 Hz. For example, the RGB code corresponding to binary arrangement 00000000000000000000000000 (RGB Code Red 0, Green 0, Blue 0) may be assigned a frequency of 2.400000000 MHz, and binary arrangement 00000000000000000000001 (RGB Red 0, Green 0, Blue 1) may be assigned a frequency of 2.400000005 MHz, and so on, until all bit patterns for the RGB code are assigned, going in 5 Hz increments. Using 5 Hz increments would be possible within the Wi-Fi band range. Again, the band range of frequencies chosen may be any suitable band, so long as all there are a sufficient number of different individual frequencies within the band to accommodate the number of colors used, for the particular color model used. It should be noted that 24 bit RGB code is used in the preferred embodiment (having 16,777,216 colors and therefore requiring 16,777,216 individual frequencies), other color models may be used having a different number of individual codes for a particular bit pattern (for example CMYK). In which case, whatever number of color codes are present is the number of individual frequencies that must be available for assigning to each code.

The accessing of a lookup table for generating a particular frequency by the frequency control pertaining to a given color code is why the preferred embodiment includes a receiving terminal outfitted with a parallel decoder. The same table is accessed by the system for converting the frequencies back into their corresponding color codes and ultimately the 24-bit binary strings associated with the color codes. These color codes are then reassembled for reading at the receiving terminal.

Once the binary string of data has been encoded into RGB code and associated with a given frequency per the accessed predetermined lookup table, frequency controller 211 (which may also be referred to as a frequency control) sends electrical pulses to at least one antenna 213 which then emits the frequencies pertaining to each color code from the binary string through a wireless connection 215. It should be noted that the antenna used, while it may be a commercially available antenna, will need more power than most traditional antennas, as it will be emitting variable frequencies, and as such will have fluctuations in wattage. A receiving antenna must also have a higher power antennae to receive variable frequencies, they must be outfitted with higher power transistors due to the increased impedance caused by the variable frequencies. Higher quality antennas capable of performing these functions are presently available commercially, as the disclosed system has been built and tested internally.

Continuing with FIG. 2, a decoding chip is shown in the embodiment pictured. This is because the preferred system includes the capability of transmitting as well as receiving data in variable frequencies. The decoding chip 219 decodes the frequencies received into their corresponding RGB code (through the accessing of a lookup table described above), then converts the RGB format in to its corresponding 24 bit binary string, reassembles the packets of 24 bit binary strings into the original binary string (which was encoded at an encoder), and at this point may send the string to the Device CPU 205 (also referred to as processor 1003), preferably to be decompressed (if used in conjunction with the data compression component) and accessed, and then to the output 221. Output is also described further in FIG. 23.

Figure 3:
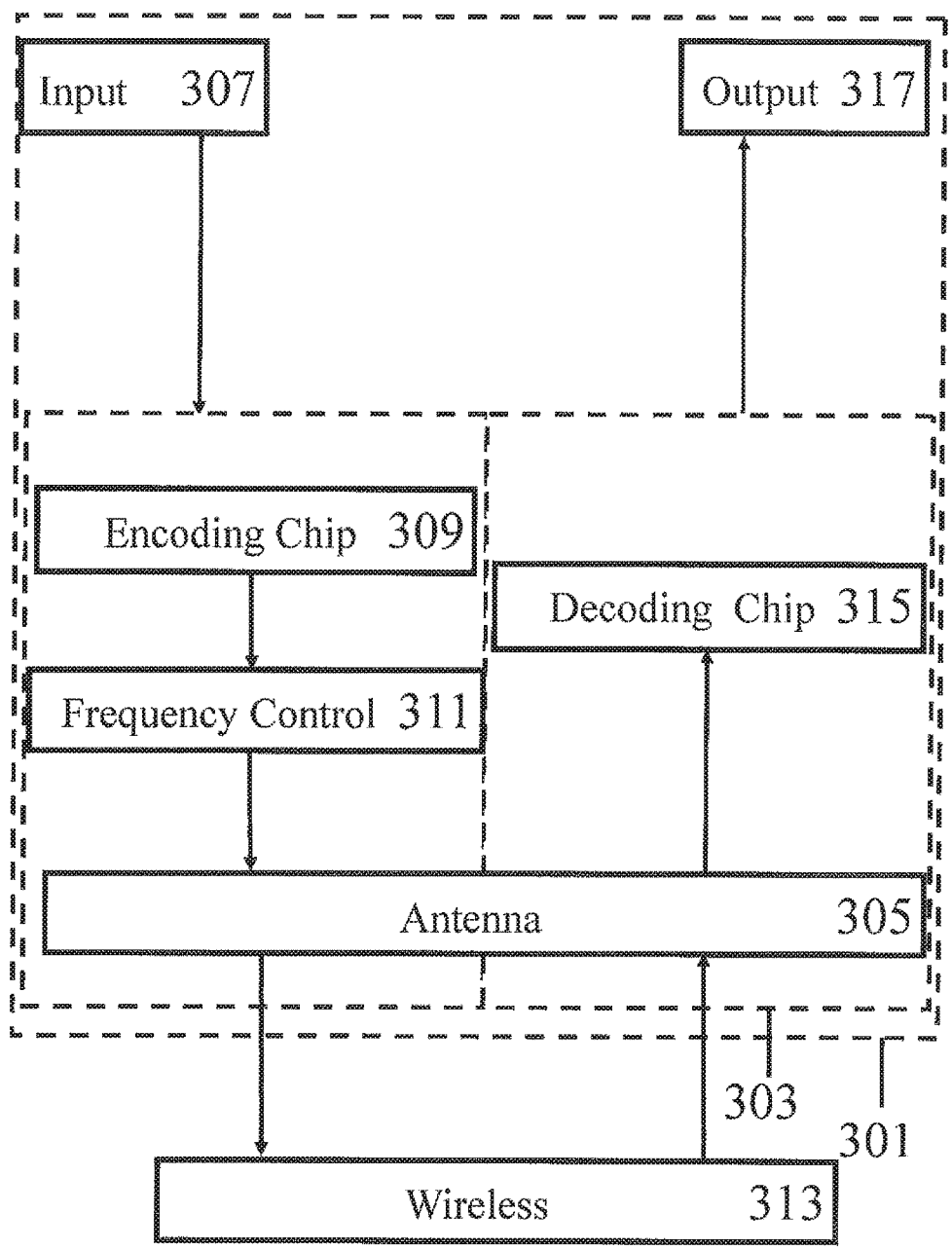
FIG. 3 is a view of an embodiment of the system comprising a router for wirelessly receiving and transmitting data in variable frequencies.

FIG. 3 shows the router 301 which comprises at least a power supply (not pictured), a PCB 303 which in the preferred embodiment is the same one as shown in FIG. 2, and at least one antenna 305. Data (as variable frequencies) coming into the router is Input 307. Input 307, for example, can be a file a user downloads.

Because the data is transmitted wirelessly from preferably a computerized device, it may be received by an antenna 305 of a router 301 in FIG. 3. The router 301 would then communicate the data through physical fiber (output 317).

This fiber may run underground and be connected to another router in another geographical location. The data may be transmitted from a physical fiber to the router through input 307. Input 307 may arrive in compressed format (from a data compression component on a transmitting terminal). In this case, the data coming in through input 307 is encoded at the encoding chip 309 which encodes the data from compressed format to RGB code and assigned its particular frequency per 24-bit RGB code. The data then goes into the frequency control 311, where the RGB code is transcribed into simple electrical impulses. These impulses are emitted by an antenna 305 wirelessly 313 using the variable frequency system and method described above.

Going the other way, if the end user wishes to upload a file, for example a file to be stored in a remote location, the data is received wirelessly 313 by the antenna 305 which emits simple electrical impulses read by the decoding chip 315 and sent to the output 317.

It should be noted that the Figures depict an embodiment of the hardware configuration for the system, however other configurations are contemplated and made part of this disclosure. For example, because the data transmitted through the PCB is preferably compressed in accordance with the data compression component described below and also in related U.S. patent application Ser. No. 14/080,248, the preferred embodiment does not include Random Access Memory (RAM) at this location, however, variations with RAM do not depart from the scope of this disclosure. The PCB must also be coupled to a power source (not pictured), for instance a Peripheral Component Interconnect (PCI) power source of 5.1V. PCB 207 is also coupled to an input/output 1019. There may be transistors in the PCB for handling power (not pictured in FIG. 4, for example, because the PCB 207 is preferably made to be used in a motherboard coupled with its own power source.)

Figure 4:
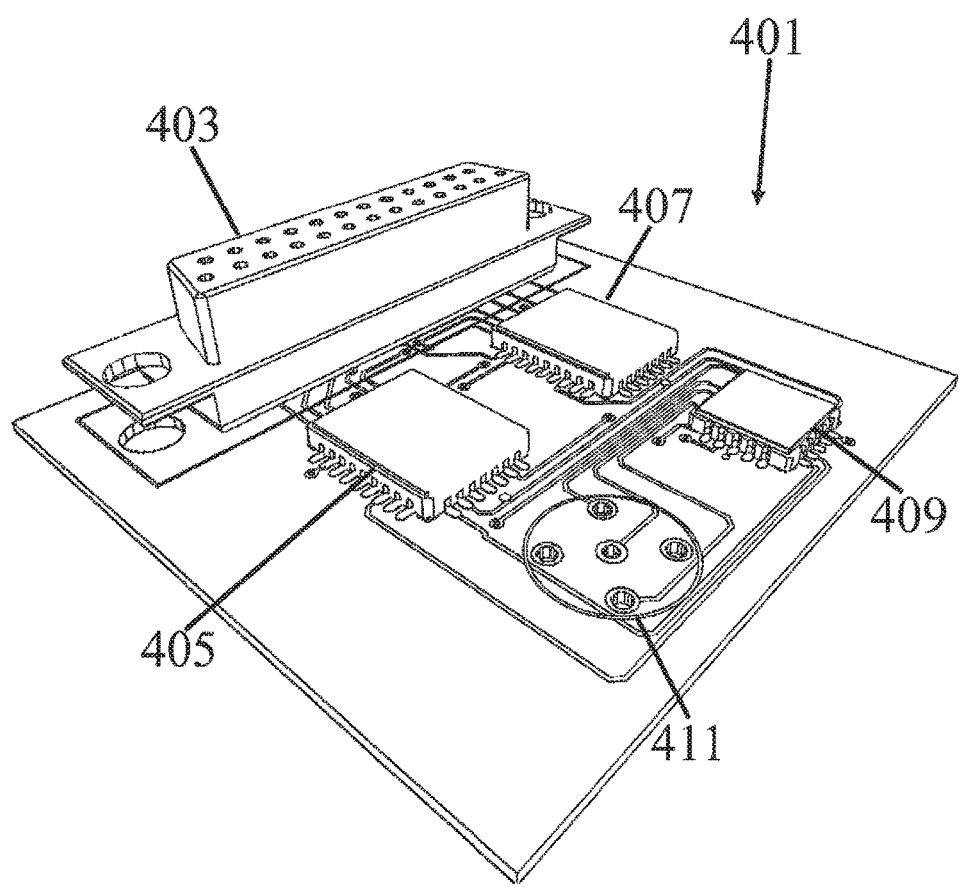
FIG. 4 is a perspective view of a PCB for housing components of an embodiment of the system.

FIG. 4 shows a perspective view of the preferred embodiment of a PCB 401, provided to further illustrate the hardware. Connector 403 can be any generic plug capable receiving an outputting data along with power. Shown is a standard extended VGA connector, however, it can be any connector with similar capability. Also shown are the encoding chip 405, the decoding chip 407, and the frequency control 409, and the antenna output 411. Antenna output 411 is shown depicted with five circles, two corresponding to the positive and negative terminals for input/output respectively, and one central circle depicting the ground. The core/register/clock referred to in FIG. 3 are not shown in this diagram for ease of view.

Figure 5:
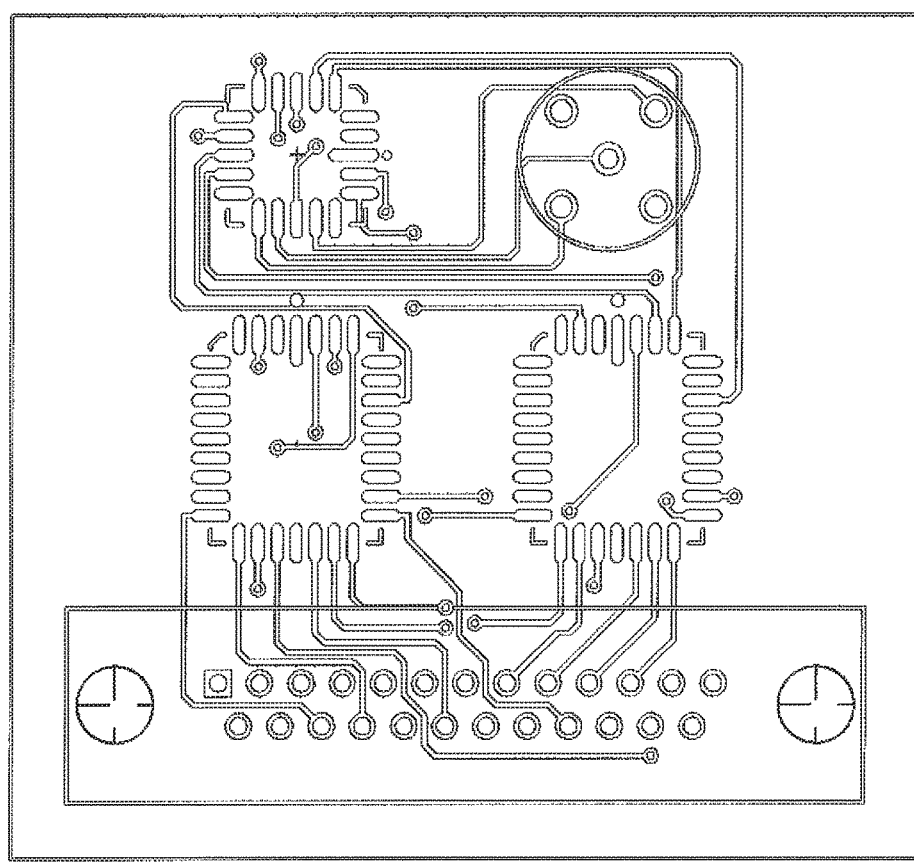
FIG. 5 is an alternate view of the PCB for housing components of an embodiment of the system.
Figure 6:
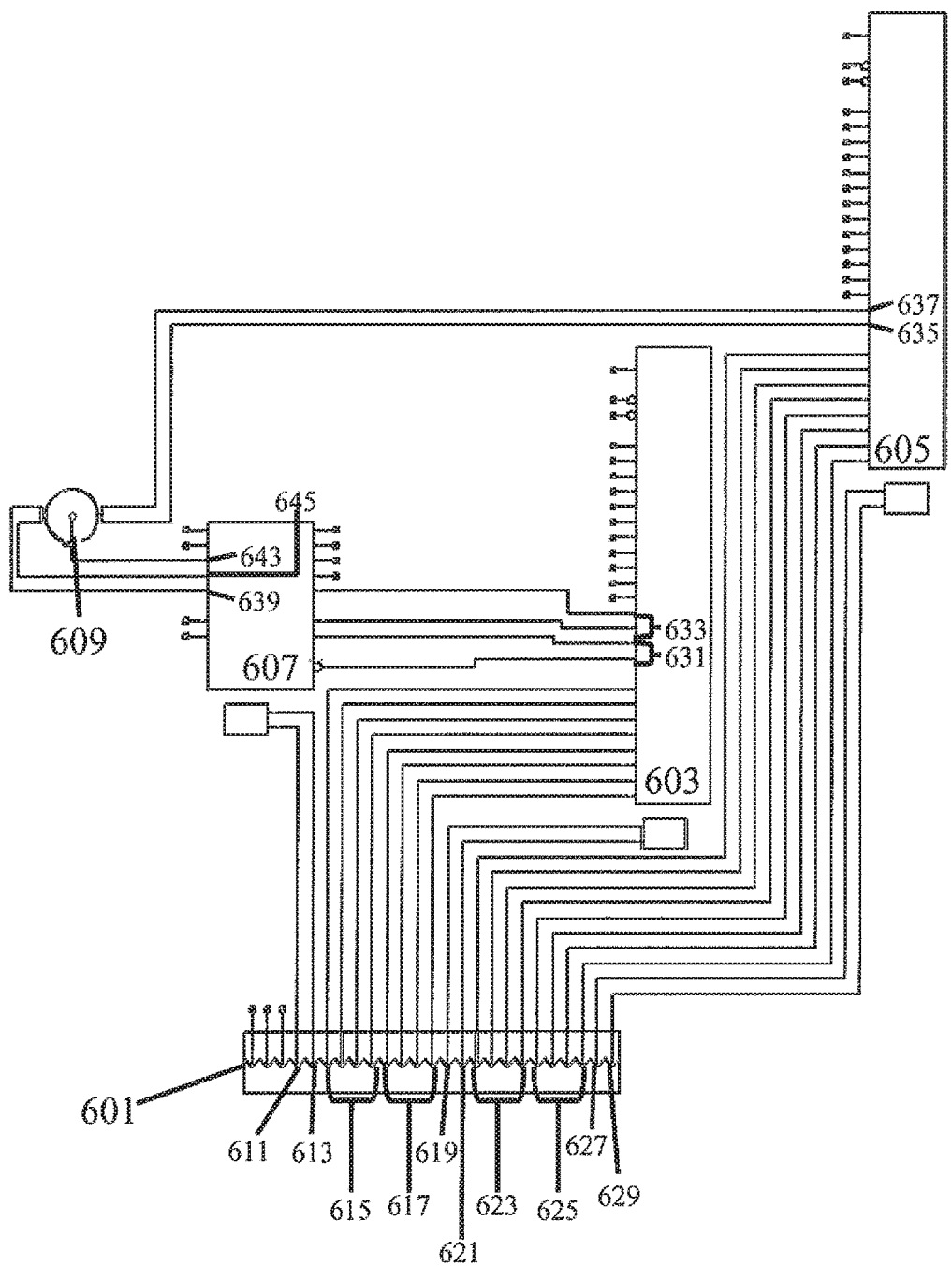
FIG. 6 shows the connections between components housed on the PCB in accordance with an embodiment.

FIG. 5 is another view of the PCB. This figure has been provided for illustrative purposes. FIG. 6 is a detailed schematic of an embodiment of the PCB. Connector 601, encoding chip 603, decoding chip 605, frequency control 607, and antenna output 609. Connections are explained in the following:

Connection 611 is the negative power connection for chip 607.

Connection 613 is positive power for chip 607

Connections 615 are the positive input for chip 603

Connections 617 are the negative input connections for chip 603

Connection 619 is the negative power connection for chip 603

Connection 621 is the positive power connection for chip 603

Connections 623 are the positive data output connections for chip 605

Connections 625 are the negative data output connections for chip 605.

Connection 627 is the negative power connection for chip 605.

Connection 629 is the positive power connection for chip 605.

Cons 631 are the negative data connections from chip 603 to chip 607

Cons 633 are the positive data connections from chip 603 to chip 607

Connections 635 are the negative data connections between chips 605 and antenna output 609.

Connections 637 are the positive data connections between chip 605 and antenna output 609.

Connections 639 are the negative data connections from chip 607 to antenna output 609.

Connections 643 are the positive data connections from chip 607 and antenna output 609

Connection 645 is the ground connection from chip 607 to antenna output 609

Because the data transmitted through the PCB is compressed, the preferred embodiment does not include Random Access Memory (RAM), however, variations with RAM do not depart from the scope of this disclosure.

Figure 7:
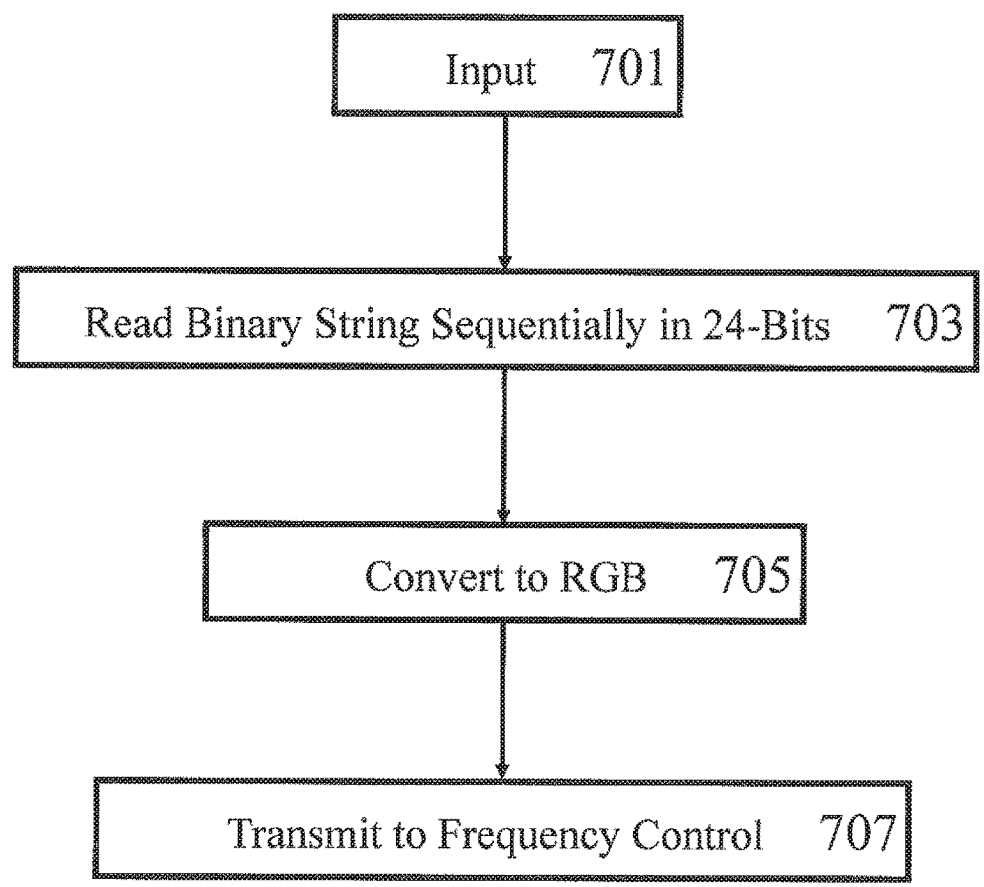
FIG. 7 shows a method for encoding data at the encoding chip in accordance with an embodiment.

FIG. 7 shows the detail process performed by the encoder 209. By way of example of the method employed by the system, a binary string of 1 MB corresponds to an $8 \times 10^6$ bit file. In order to transmit the 1 MB string, the string would first be read sequentially in 24 bit packets. This can also be explained as breaking the binary string in 24 bit packets. For the purpose of this example, the 24-bit packet will be referred to as a substring. There are $3.33 \times 10^5$ 24-bit substrings in the binary string and a remaining 8 bits. For the first $3.33 \times 10^5$ 24-bit substrings, the corresponding color associated with that particular 24-bit binary substring would be assigned (step 705), assigned a predetermined frequency from a lookup table, and transmitted to the frequency controller 707.

The remaining 8 bits would be built up to 24 bits using a standard convention, for example, assigning all zeros to build up the last 8 bits to a 24 bit substring. The last substring would also then be assigned the RGB color corresponding to the built-up substring. Once the binary string has been converted to RGB in this manner, the RGB code is translated into its predetermined frequency and sent to the Frequency Controller 707, which converts the RGB code into electrical pulses directing the antenna to oscillate at the frequencies pertaining to the binary string (represented as RGB colors via translation in the lookup table), sequentially.

To further illustrate the method, FIG. 8 shows a random selection of 24 bit binary strings and their corresponding color in RGB code. These 24 bit substrings may be partitions, packets or substrings taken from a much longer binary string corresponding to the original data (or compressed data). FIG. 8 illustrates that each 24 bit packet would correspond to a particular shade of the Red, Blue, and Green of the RGB code. For example, for the first string, 111111110000000000000000, the corresponding color would be a combination of R 255, G 0 and B 0. This corresponds to a particular color that the frequency controller may direct the antenna to transmit, in the embodiment where the data set or lookup table used to encode the 24 bit packets is a color model.

In the 24 bit example above, the number of different frequencies possible is the number of possibilities of 0 and 1 combinations 24-bit in length, allowing for approximately 16.7 million unique frequencies. This embodiment would permit 24 bits of data to be transmitted in one frequency. However, other efficiency gains would be made by other sized partitions resulting in fewer operations, function and method calls, which would draw upon less power. For this reason, the size of the partition may vary in various embodiments, and are considered a part of this disclosure. For example. The data set used could be 12-bit RGB. For 12 bit RGB, there are 4,096 possible combinations of 0's and 1's 12-bits in length. Alternatively, the predetermined frequencies could be assigned according to 8 bit RGB code. In the 8-bit embodiment, 8 bits of data may be transmitted in one unique frequency.

Further, while RGB is used as an exemplar data set, any data set or lookup table may be used to assign a predetermined frequency with a particular pattern (or length). The above example uses RGB as a data set. "Data set" refers to any representation used to "translate" one thing to another, such as a look up table. For instance, in the case of the RGB example, a particular substring is assigned a predetermined frequency. In the case of binary, there could be any predetermined frequency for a given 0/1 bit pattern of a predetermined length. Continuing with the RGB example, where the known RGB code is used as the code for translating a bit pattern with a particular color (which is then made available for transmission as a predetermined frequency), the data could be partitioned into substrings of all 8 bit lengths, or all 24 bit lengths, or any other predetermined length. The data could also be partitioned into substrings having variable length, depending on the current processing resources available on the overall terminal. For example, the system operating on a 100 bit data may partition it into eight 8-bit partitions, and one 24 bit partition, then one 12 bit partition, for a total of 100 bits and 10 different assigned frequencies adapted for transmission to another terminal. There may be several lookup tables for assigning a particular frequency with the substring of any predetermined length. Presently, the system would preferably run at a one predetermined bit length and corresponding lookup table for assigning the predetermined frequency for the particular substring's pattern. However, limitation to one length substring is not required when handling a given data.

The data set used is not limited to RGB code and may be any data set. RGB is supplied as an example as it is a known code/lookup table. For example, in 8 bit RGB, the bit pattern 00001111 is a particular color, which may be assigned a particular frequency. However, any code or lookup table may be used to associate a particular substring (of any particular length) with a particular frequency. This assignment creates a predetermined frequency for a particular substring. The assignment of the predetermined frequency may be directly or indirectly correlated with the substring or partition. In embodiments employing RGB code, it is understood that any type of RGB code may be used (ex. 8 bit RGB code for substrings 8 bits in length, 12 bit RGB code for substrings 12 bits in length, etc.). If using 12 bit RGB, the system in an embodiment may be architected using a Broadcom BCM4360 gigabit transceiver, for example, as the transceiver may be adapted for transmission of 4,096 frequencies, each associated with a given bit pattern 12-bits long. (The 4,096 different frequencies for the 12-bit example is due to the fact that for a binary string 12 bits long, there are 4,096 different possible patterns of 0/1's.) The 24 bit example above would relay a representation of more bits per pulse, however, it would require a transceiver capable of transmitting approximately 16.7 million different frequencies. Processing time may be affected using a lookup table having fewer possibilities of 0/1 bit patterns than with the possibilities of bit patterns having 24 bit lengths. It is understood that with ongoing improvements to processing speeds, that the length of the substring may be increased without reduction in overall system efficiency (both processing efficiency and "efficiency" in terms of the number of bits represented by a single pulse).

The system may be architected in a number of ways. Embodiments include one terminal with transmission and receipt capabilities, or a plurality of terminals, which may be linked on a hosted peer to peer network, or a plurality of terminals (which may each have transmission or receipt capabilities, or both). One or all terminals on a hosted network may create an ad hoc network to share its network with another terminal. Embodiments may include full duplex, half duplex, or simplex transmission from one terminal to another.

The inventor herein has architected for noncommercial use one embodiment using commercially available components modified as discussed herein. For example, a 3-band Broadcom™ BCM4360 Gigabit transceiver (or other similar transceiver) having 802.11ac capability retained on two bands for Windows socket compatibility for use with ordinary data transmission may be used. A third band originally outfitted with 802.11n legacy capability was removed and replaced with the 12-bit partitioning and encoding/transcoding capabilities described above (transcoding/encoding referring to partitioning any data (which may be raw data or binary data, for ex.) and assign the partition a unique predetermined frequency or vice versa) by a firmware change so that the frequencies possible for the antenna to emit and/or receive are the spectrum of 4,096 unique predetermined frequencies that are assigned to a given partition's pattern and not simply 802.11ac original capability of the Broadcom™ transceiver employed. Other features of the commercially available transceiver may be altered, such as by disabling the Bluctooth™ coexistence or retaining other capabilities such as the SSID discovery ability. In this exemplar embodiment, the transceiver may communicate with a PCIe interface such as an ASUS PCE-AC68 network interface with the Broadcom™ chip's firmware modified as discussed above. These two components may then be incorporated into a computing device having a standard Intel SoC CPU clocked at 3.2 Ghz, standard motherboard and chipset. The hard drive may be a SATA hard disk drive. The system may be powered by any standard power supply, such as an ATX power supply.

Figure 9:
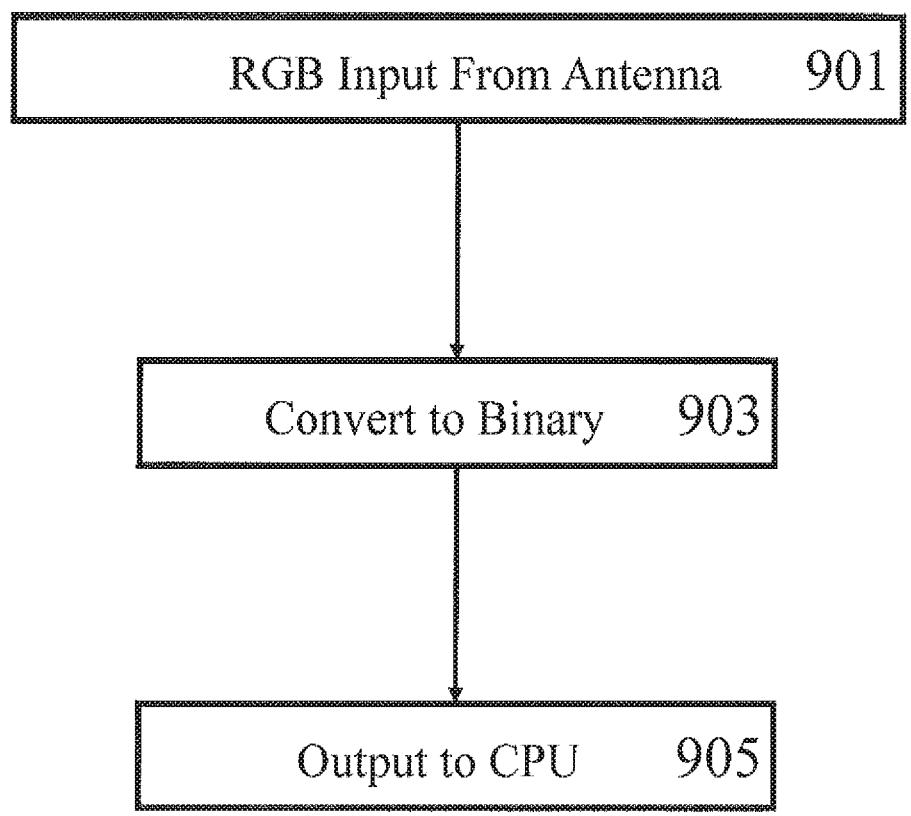
FIG. 9 shows a method for decoding data at the decoding chip in accordance with an embodiment.

FIG. 9 shows the operation performed by the decoder ("decoding chip" in the preferred embodiment). Decoding may also take place at the transcoder. One or more RGB codes (or other code obtained from a data set/lookup table) is received as variable frequencies by the antenna 901. Continuing with the RBD color code example, these frequencies are then translated back into their color codes via accessing a predetermined lookup table (described above), then converted back in to the corresponding 24 bit binary pattern 903. If the original data is not perfectly divisible by 24 bits, the same convention may be employed to "build up" the last substring to 24 bits for transmission as a color. Another way of explaining this is that it often occurs that the data itself is not divisible by the bit depth of the color used. In the case of the example provided, if an 8-Bit string is sent into the Encoding Chip 209; the Encoding Chip 211 will "see" it as a 24-Bit string, but the last 16-Bits will simply be 0's. The decoding chip 219 will therefore decode it back into the 8-Bits due to its knowledge of the size of the string in the first place.

Data Compression Component

Below is disclosed a data compression component (also referred to as the "compression component") that is in communication with and preferably coupled with the system for variable frequency data transmission. For clarity, the term "system" shall refer to the variable frequency data transmission system both alone or in combination with the data compression component below. This data compression and transmission "system" is disclosed in the related U.S. patent application Ser. No. 14/080,248 filed Nov. 14, 2013, to Nicolas T. M. Dupont, but for ease of reference shall be referred to as the "data compression component" or simply "compression component" herein.

Figure 10:
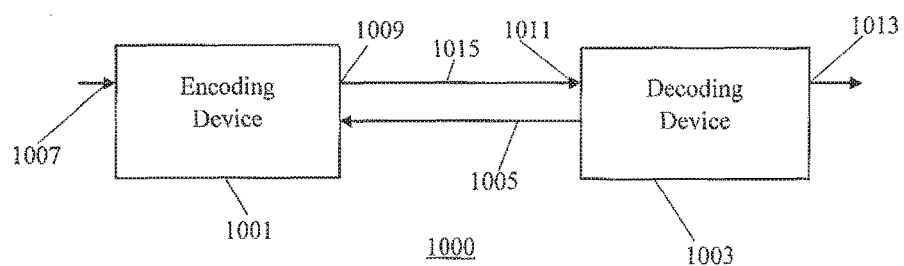
FIG. 10 shows an exemplar hardware architecture for an embodiment of the system.
Figure 11:
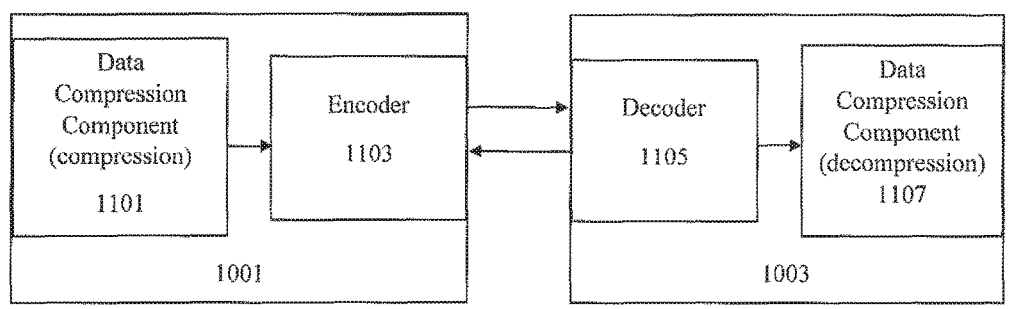
FIG. 11 shows an exemplar encoder and decoder, in accordance with an embodiment.

FIGS. 10 and 11 show a high level view of the system. A high level view of the system is a system preferably comprising at least one transmitting terminal (encoding device 1001) and receiving terminal (decoding device 1003), wherein the transmitting terminal 1001 and receiving terminal 1003 are separate terminals (each coupled with at least one antenna), such as two computerized devices connected by communication channel 1005, 1015. Transmitting terminal 1001 and receiving terminal 1003 may also be housed on the same component in communication with one another.

Because this system deals with wireless communication, the channel 1005, 1015 shall be a wireless communication channel. By way of example, this connection channel may be wireless communication between a first laptop computer and a router where the router is in communication with a physical communication channel, such as a fiber (which may be a web of fibers), where the fiber communicates with at least one other router having an antenna for wirelessly communicating with a second laptop computer.

FIG. 11 shows an embodiment where the encoding device 1001 further comprises the data compression component 1101. In this embodiment, the decoding device also is coupled with the parallel data compression component 1107 for decompressing the data received from the encoding device. Also, in this embodiment, both the encoding device 1003 and decoding device 1003 further comprise the receiving and transmitting antennas.

The preferred embodiment interposes the system's variable frequency data transmission componentry (at encoder 1103 and decoder 1105) following compression by the data compression component 1101 and prior to transmission of the compressed file via the channel. 1005, 1015.

The data compression component which is embodied in one aspect of the system is a component comprising a subsystem and method for compressing binary code which will be input into the encoding device for encoding into RGB code. In another aspect, the data compression component comprises both an encoding and decoding device, for the purpose of compressing and decompressing data, respectively, according to the data compression method disclosed below. The data compression component compresses pure binary code. Because of this, the compression method operates to compress data irrespective of the type of data. There are currently no compression systems that compress data based on pure binary code.

In one embodiment, the data compression component assigns values to all arrangements of binary code possible for a particular file size and transmits the code instead of the file. This is done by packaging the binary into two-bit packets, assigning values to those two bit packets, and then using that code to generate compression keys. The compression keys are then used to translate an uncompressed file into a compressed file—and vice versa on a parallel decompression.

This data compression component is an improvement in the efficiency of compression because it considerably simplifies the process of compression. One of the simplifications is that this system compresses pure binary code, regardless of what the code stands for. Previous systems compress data based on the content of the data—in other words what the raw binary code stands for (example, removing redundant pixels in an image file). This is the distinction between the physical versus application layer compression. There are no known compression schemes which work on the physical layer. Because this is a physical layer compression scheme, the system is a cleaner and much more efficient process for compressing data.

Although the disclosure involves something most akin to "data compression" or "compression" (and so for convenience, that terminology is used), one difference is that the method disclosed involves the manner in which the binary code is handled as well as a mode of compression (and subsequent decompression) of what is commonly referred to as "data" (a translated binary, such as a file readable on the application layer of a computing system—for example a text file using a series of characters (bytes)). This system is best described as a compression of any binary strong, such as the binary form of any data.

Binary code which may be compressed by the data compression component may be of any type of data file (image, audio, or any other format of data). Because the data compression component does not look at the "data," but instead looks at the raw binary code (or other type of raw data) when compressing in order to compress the raw binary, it is a much simpler and more efficient manner of compression. For instance, previous compression of images required complex algorithms and systems for determining which pixels may be redundant and therefore "eliminated" in a compressed file. Or, for example, Huffman coding can be used to compress a text file, among other file types. The premise of this coding is that characters which repeat most often (for instance a space) are assigned a much shorter code of bits, so that when translated for transmission, the whole file is much shorter. Basically, the way these systems work is that they require knowledge of what the raw data stands for in order to decide what can be removed from a file for the purpose of compression. This system bypasses the complex undertaking of analyzing the content of a particular data (ex. what characters a particular byte sequence stands for) and operates only on the raw data.

Figure 12:
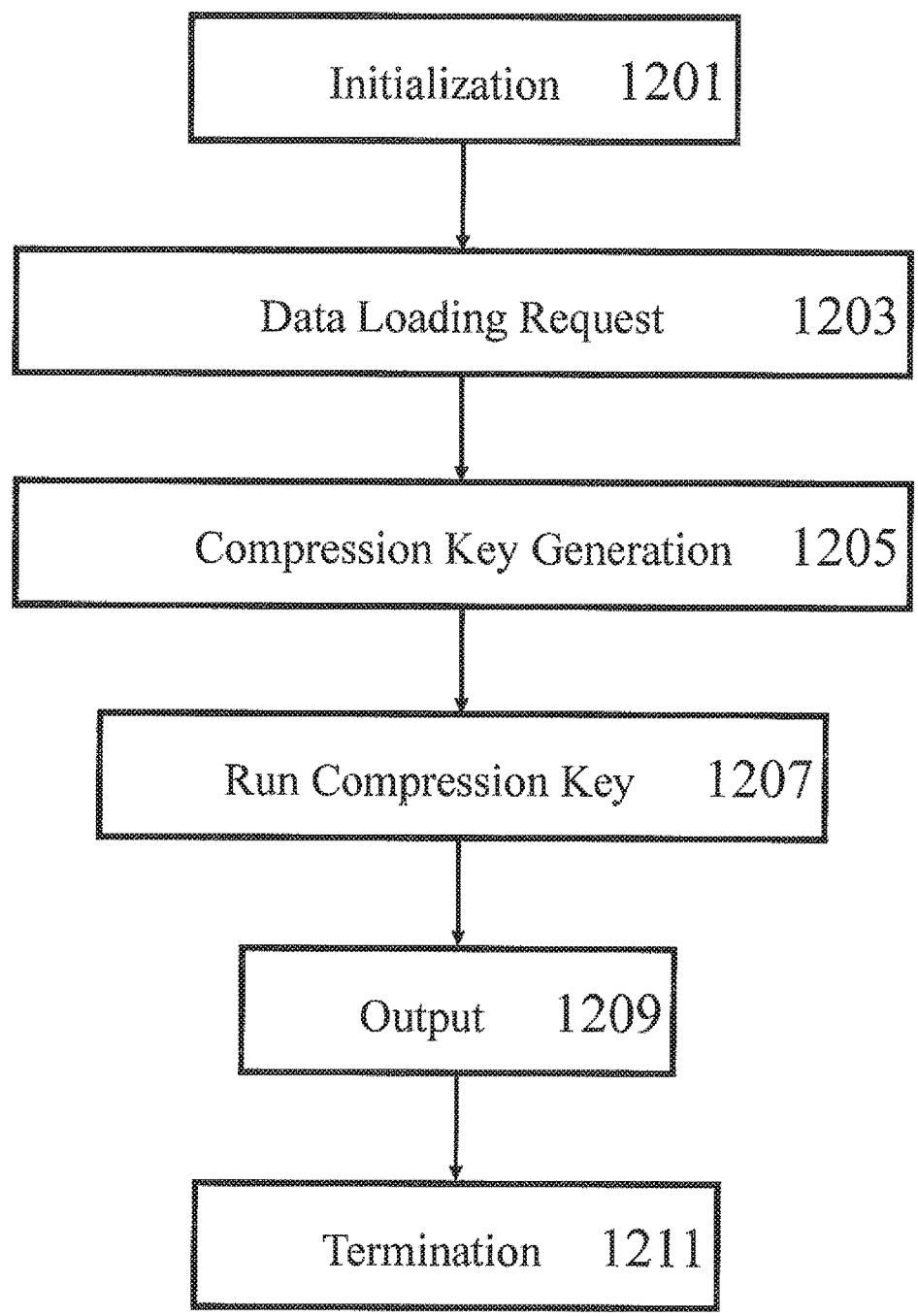
FIG. 12 is an embodiment of the data compression component.

FIG. 12 shows a basic method for packaging data to be transmitted in compressed formats for faster data transmission and the handling of data to be compressed in accordance with an embodiment. The method operates on data to be transmitted by an encoding device 1201 so that the quantity of bits transmitted is smaller than the number of bits in the original data file. In one embodiment, the data compression component also comprises a parallel decompression 1107. Data that is transmitted is received by decoding device 1003 and decompressed to represent the original file.

Figure 13:
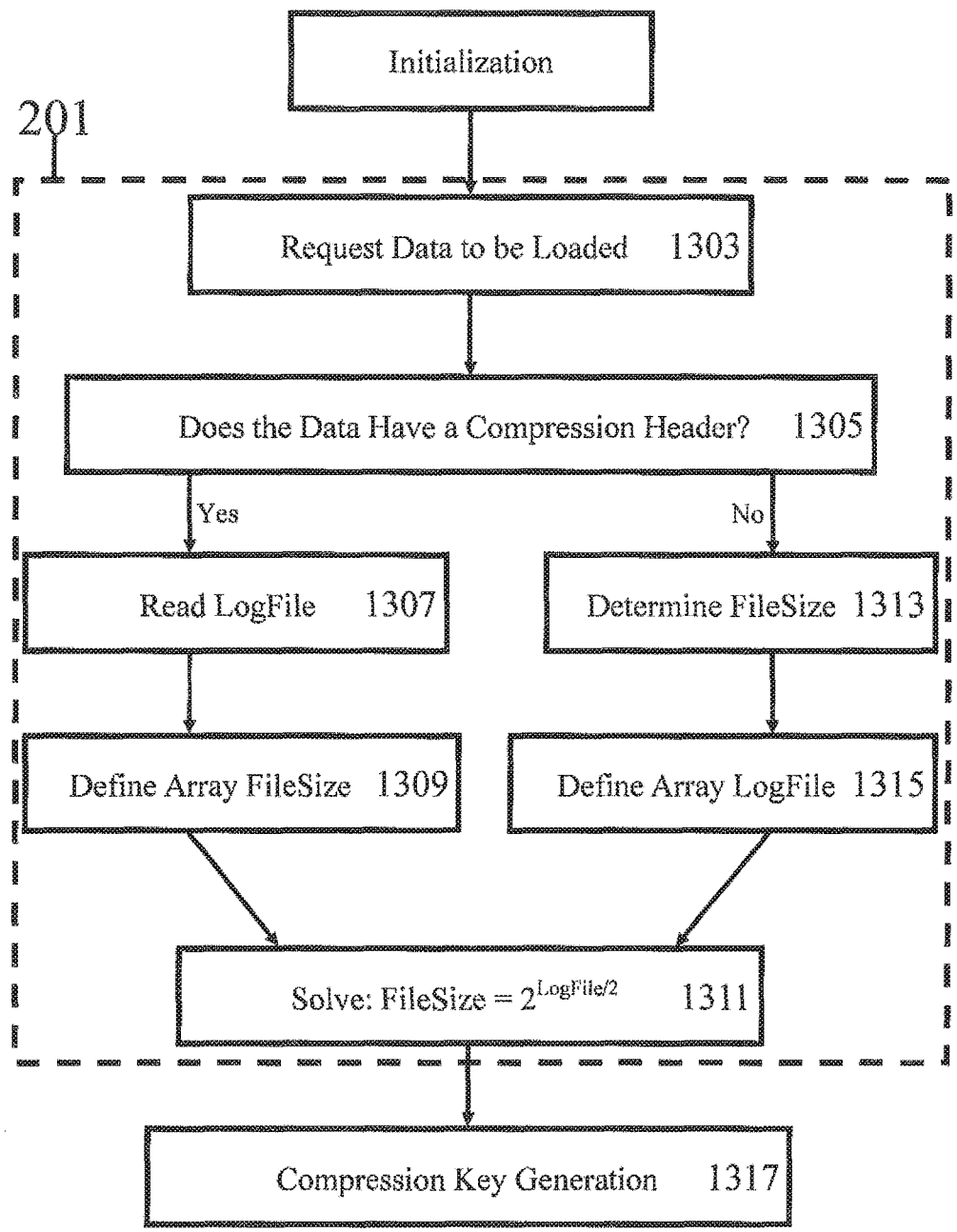
FIG. 13 shows a process for a data loading request in accordance with an embodiment of the data compression component.
Figure 21:
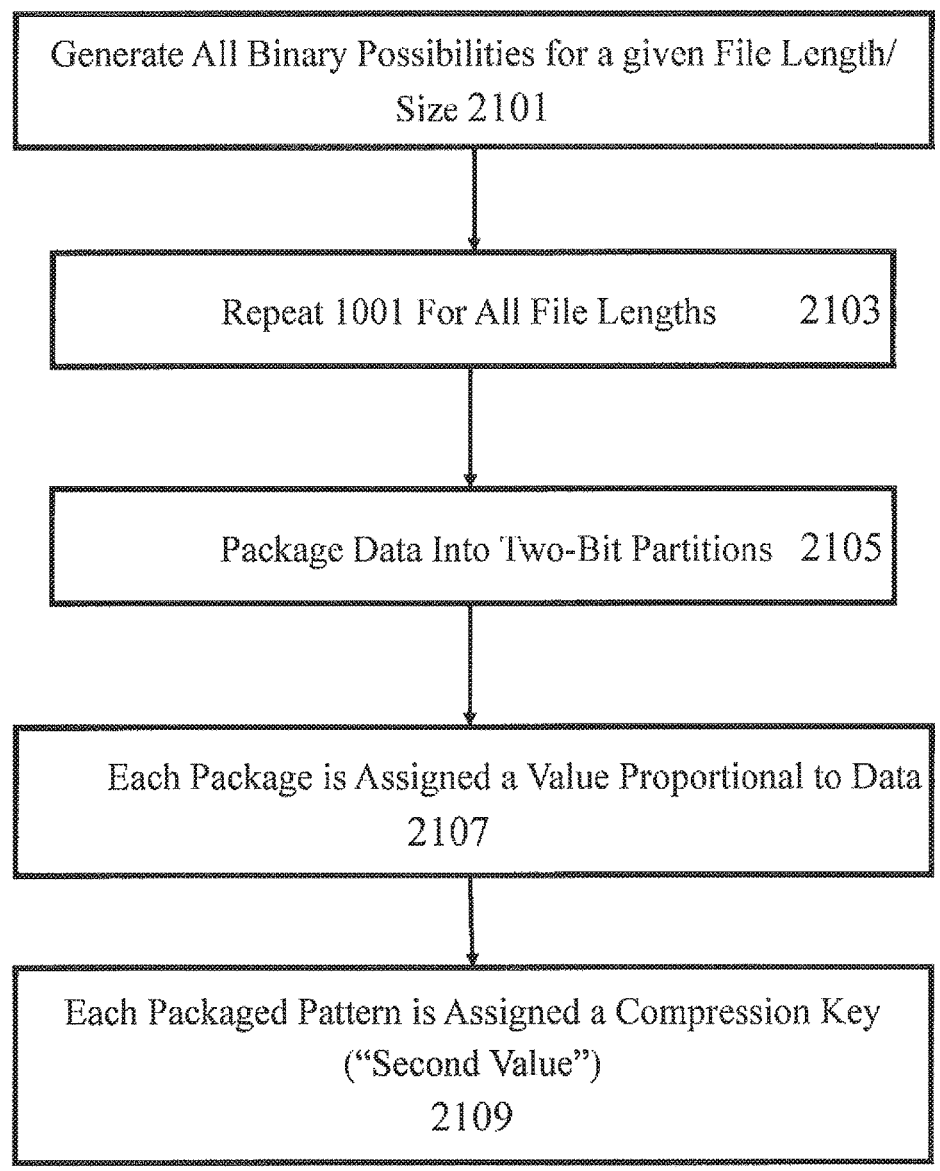
FIG. 21 shows an alternate view of the process of generating the compression key tables in accordance with an embodiment of the data compression component.
Figure 22:
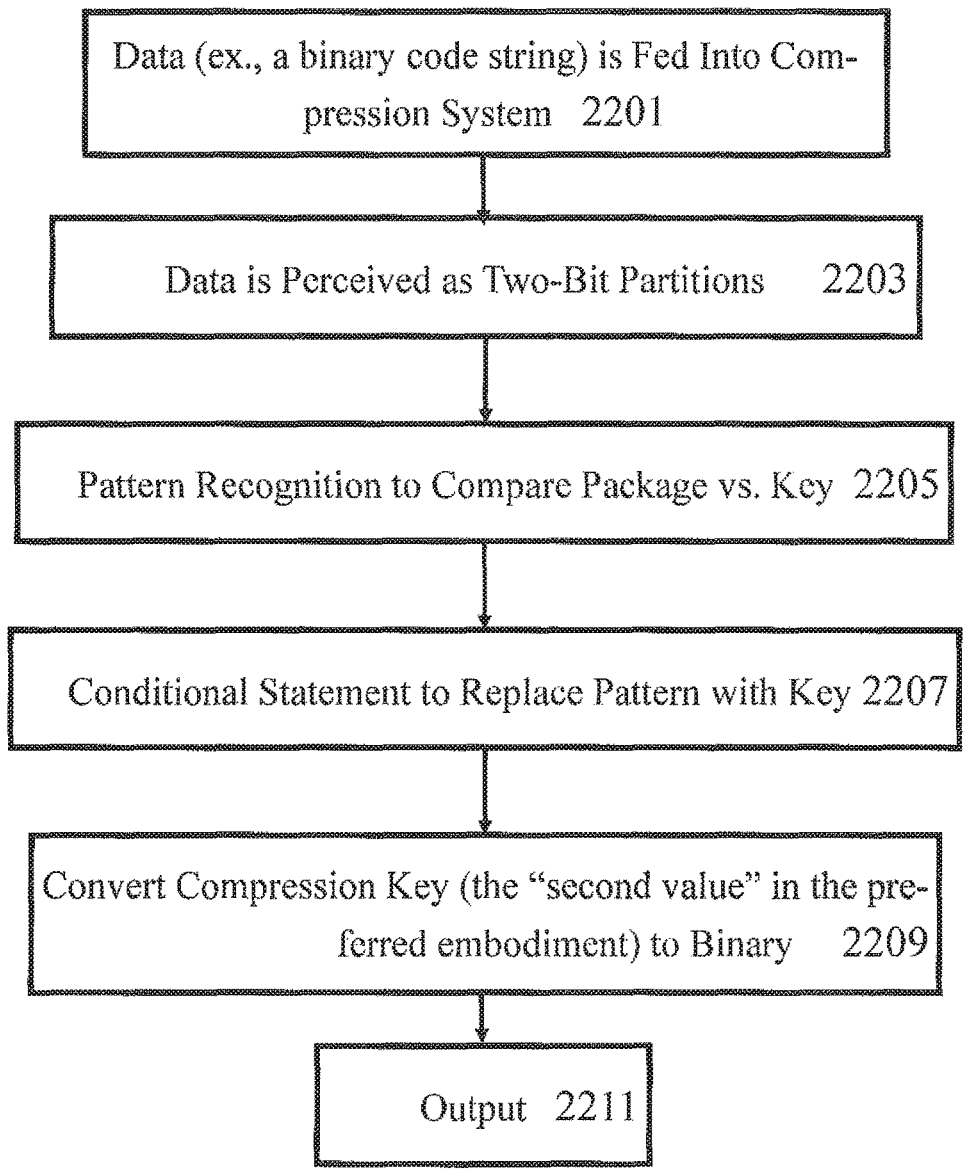
FIG. 22 shows an exemplar process for data compression in accordance with an embodiment of the data compression component.

The method can be seen as having two parts in an embodiment. One is the preparation of the compression keys to be used in data compression 1201, 1203, 1205, and one is the actual compression of a data input 1207, 1209. FIGS. 14-16, 18 deal with the preparation of the compression keys to be used in compression. FIGS. 13, 17 and 19 deal with the handling of a given data to be compressed. FIGS. 21-22 are an alternative depiction of the data compression component and methods described.

FIG. 12 shows an overarching preferred embodiment for the compression method to compress a given data. Implemented in a computerized device, Step 1201 may be program instructions for the initialization, which is basically a header and for instructions to execute the method. This step may vary depending on the programmer and several initialization operations may be used. The next step may involve a data loading request 1203 (explained further in FIG. 13) followed by a compression key generation 1205. (Step 1205 is further detailed in FIG. 14 at 1401).

The next step involves the compression of actual input data; this is the running of the compression key 1207. Initially, data must be received from an input source (not pictured). The data source could be from a data provider, data storage device, or other data source. Then the data must be compared with the appropriate table such that a compression key corresponding to the file may be generated.

The next step is output 109, 1209. For a compression, an instructions header is included in the compressed file to be output 109. The header file serves as a logfile to record how the data was compressed for the purpose of decoding/decompression; during decompression, the header will instruct the program to decode the compressed file such that the uncompressed data may be regenerated at the receiving location. Output 109 destination may be a storage device, a computing system, or other system that will store, process, or otherwise utilize the compressed data. Once data is outputted 109, for instance to the operating system, the program can terminate 111 and the script is over.

FIG. 2 shows a subprocess for handling incoming data 201. There are two paths or "sequences" shown. Sequence 203, 205, 213, 215, 211, 217 applies for incoming data that is not yet compressed in accordance with the methods herein (however, the incoming data may comprise data compressed from another compression scheme). Therefore, this data is the data to be encoded (compressed) by the encoding device. The encoding device may be part of a transcoder 309, which may serve both as the encoding device and the decoding device. Further, the transcoder 2501 may be part of the transceiver 2503 in an embodiment, which may also house one more frequency controls. Although alternate flows are contemplated, one embodiment comprises a check of the incoming data file for a compression header 205. In this sequence, the file has not been compressed (in accordance with the method described herein), so the determination would be negative 205. If the outcome of determination 205 is negative, the size of the file is determined 213 and an array is defined called Logfile, to accept a value of Logfile based on the solving of equation 211. The equation $FileSize=2^{Logfile/2}$ 211 is then calculated as a check to ensure the original file is not corrupt, although other appropriate checksums may be employed.

Sequence 203, 205, 207, 209, 211, 217 applies for incoming data which is already compressed. In that scenario, data may be decompressed in a parallel running of the compression key to find the original data's counterpart to its compressed code. This operation is performed by the decoding device 1003. In this embodiment, there is a compression header including the variable LogFile, which was calculated and placed in the header of the compressed file by the encoding device 1001. If the file has a compression header, then Logfile is read 1307 and an array defined, FileSize. 1309. Then solve the equation $FileSize=2^{Logfile/2}$ 1311 where FileSize is an array that can hold any amount of data. FileSize also refers to the size of the file to be compressed in bits or bytes. Logfile is a file that is created during compression and available all the way until the decompression serving as a "log" of the compression and is placed in the compression header. LogFile is variable based on the FileSize.

Figure 14:
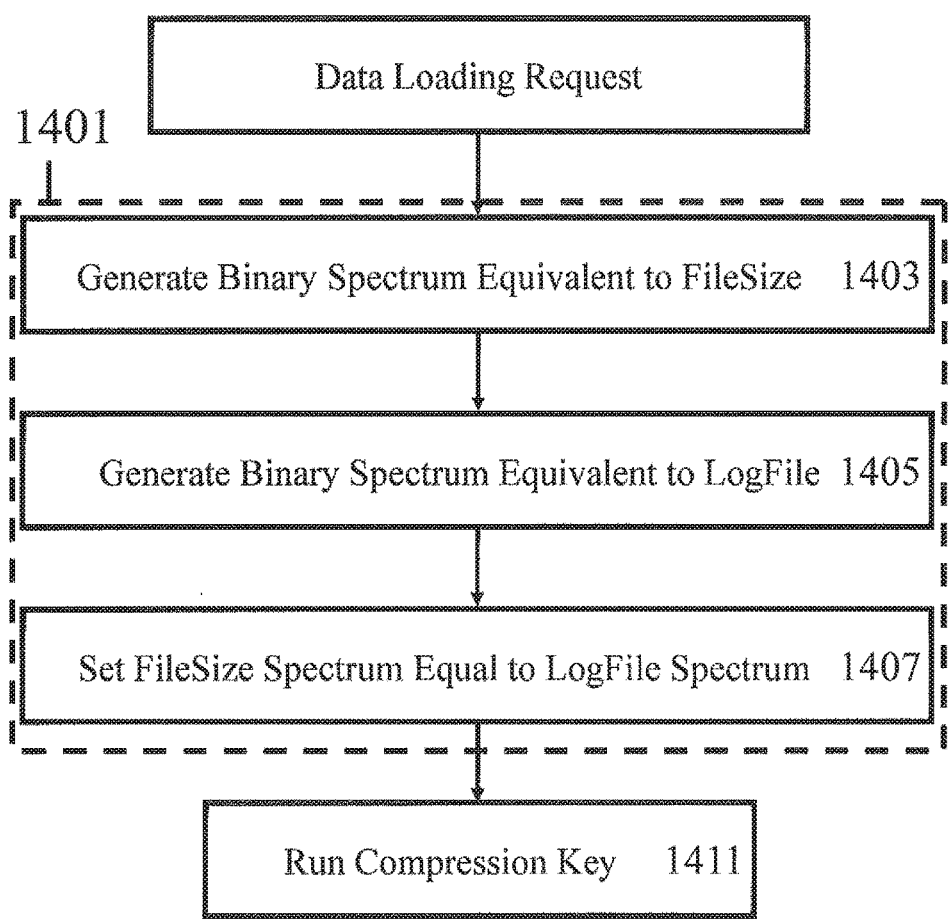
FIG. 14 shows a process for generating a compression key in accordance with an embodiment of the data compression component.

FIG. 14 is a detail of the compression key generation 1205, 1401. Because the disclosed compression method calls upon pre-generated compression keys, the manner in which the compression keys are generated is provided. It should be noted that the generation of compression keys operates on binary strings regardless of data type and makes use of preferably two bit packaging of binary data in conjunction with pattern recognition and the assigning of values in order to facilitate and simplify data compression.

A method for generating compression keys begins with the generation of a binary spectrum equivalent to FileSize. Generating a binary spectrum for a particular FileSize 1403 means that the data compression component generates a spectrum of zeros of the same size as a given file size (also referred to herein as FileSize)—the binary spectrum is all the possibilities of zeros and ones for a file size of a given size. In the embodiment shown in in FIG. 14, a binary spectrum is also generated for LogFile 1405 (the number generated in the equation 1311) and the two are checked against one another as a checksum 1407, as a file of a file size FileSize will have a corresponding LogFile value in accordance with the solving of equation 1311 (alternate checksums may be employed). Step 1407 serves to ensure that the tables generated for LogFile and FileSize align and relate to each other based on the solving of the equation 1311. For instance, for a given FileSize, the data compression component will check to ensure the appropriate LogFile is returned based off the simple equation 1311 as a check. This may also be performed as a return of a ratio between the two.

Figure 15:
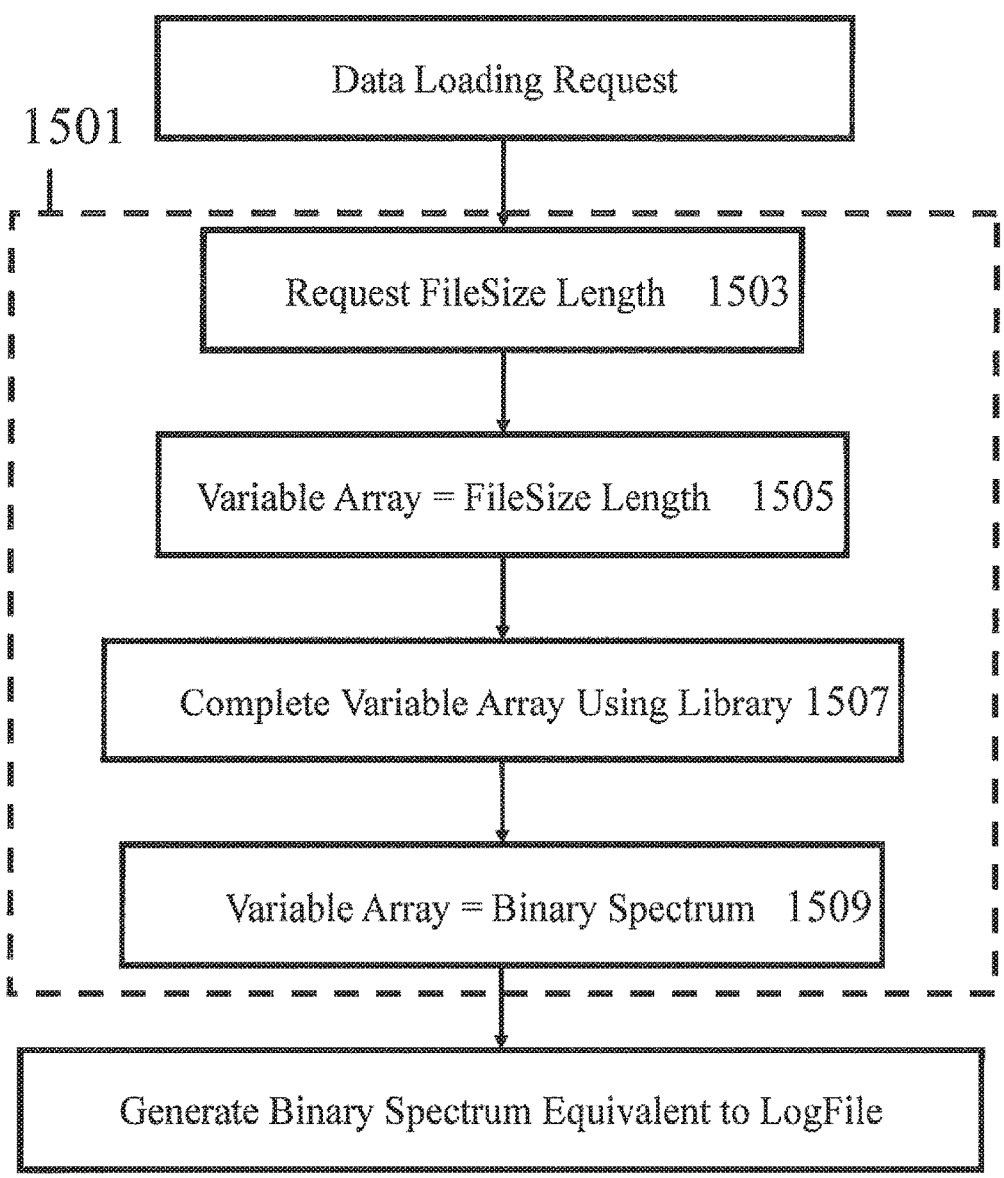
FIG. 15 shows a more detailed view of the generation of a binary spectrum for a file of a given file size in accordance with an embodiment of the data compression component.

FIG. 15 is the calculation of the binary possibilities for a particular file size, while FIG. 5 is the generation of the binary possibilities for Logfile. The generation of compression keys is further detailed in FIG. 18.

Turning first to FIG. 15, generation of the compression keys begins with a request for the size of a given file, FileSize, 1503 and assignment of a variable array 1505. This array will hold all of the possible combinations of zeros and ones for a file of a particular FileSize, and the combinations are placed there preferably using a standard available library 1507. This array is also referred to as a table and represents the binary spectrum for a file of given FileSize. In the preferred embodiment, tables are prepared with files of all FileSizes. Also, although the preferred embodiment calls upon pre-generated compression key tables (these tables being also referred to simply as the compression key), compression keys may be performed at runtime or simultaneously with the compression. Thanks to the use of many tools in the compilation of the program, any program is rendered 'lighter' thanks to the beauty of C++ compilers. The use of real-time generation of compression key tables allows for the computer to simply launch a CPU powered comparison of the data (during compression or the compression file during decompression), which is a simple task.

Figure 16:
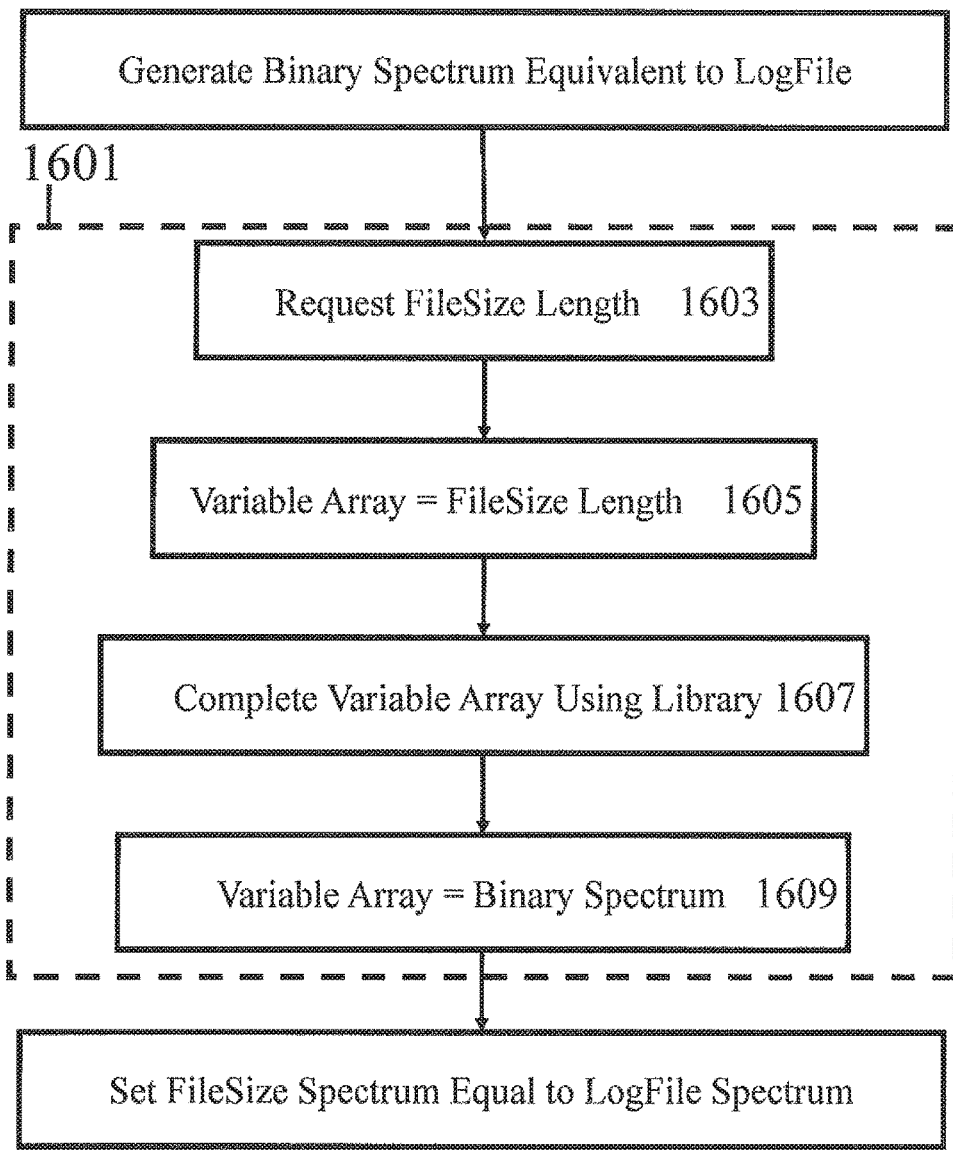
FIG. 16 shows a more detailed view of the generation of a binary spectrum for a file of a given Logfile in accordance with an embodiment of the data compression component.
Figure 17:
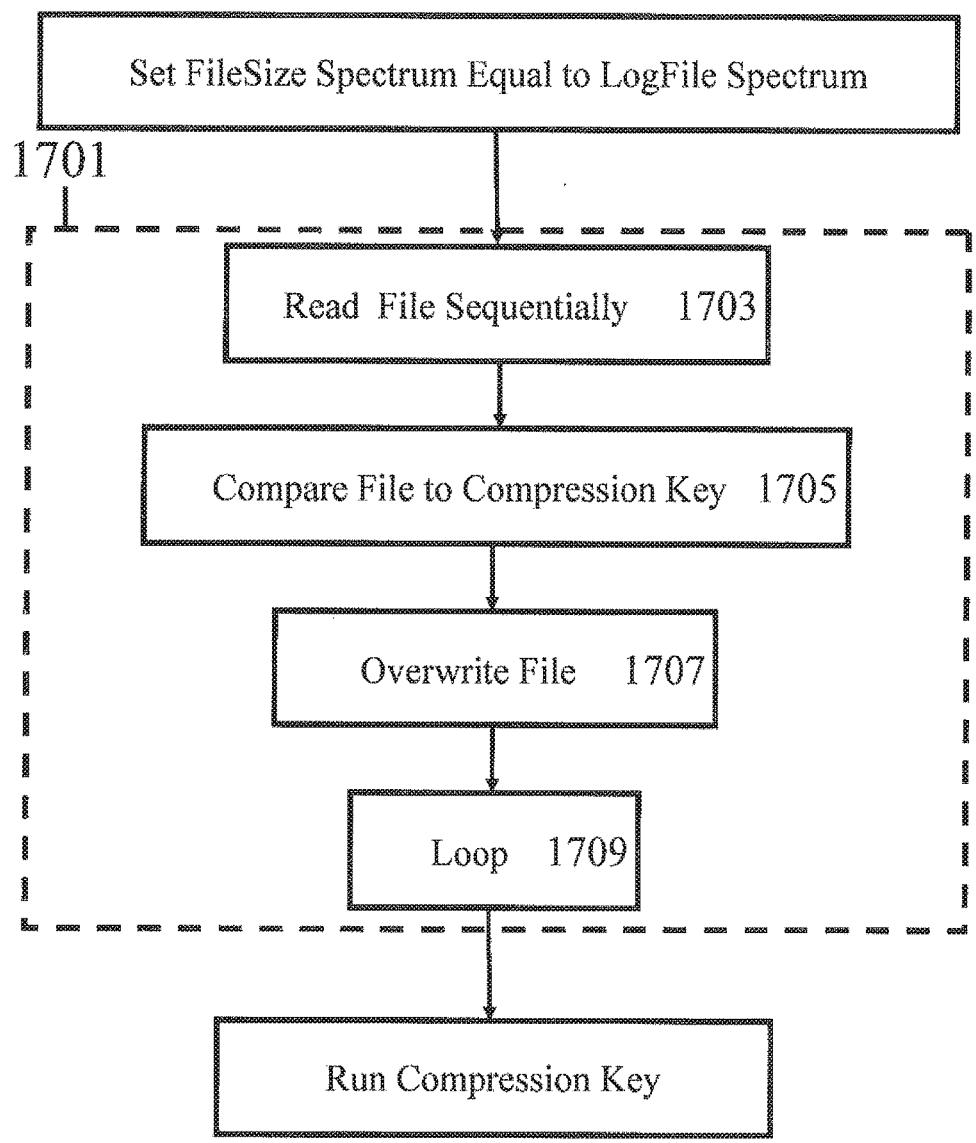
FIG. 17 shows a process for generation of the compression key in accordance with an embodiment of the data compression component.

FIG. 16 is the generation of the binary possibilities (the binary spectrum) for Logfile. This means that given a LogFile value, the data compression component will be able to call up the compression key table for the corresponding FileSize. In other words, this is the corresponding compression key generation for keys to be used in decompression, that is, to decode a compressed file into the original. For a given Logfile, subprocess 1601 may begin with the request of the corresponding FileSize 1603 and calls upon the appropriate array for the given Filesize 1605. Next, a lookup table is generated for the particular FileSize, for instance using a standard library known in the art 1607, 1609. The lookup table is preferably cached for later use.

In this disclosure, the terms "table," "compression key table" may be tables associated with a specific FileSize. These tables are used for translating between an uncompressed file and its compression key (to be transmitted as its own binary string) and vice versa. Compression key refers in most embodiments as the value assigned to a packaged bit pattern which will be transmitted in binary as the compressed file. When used in a general sense, the term "compression key" may refer to the actual table called up for a file of a given FileSize or LogFile.

Figure 18:
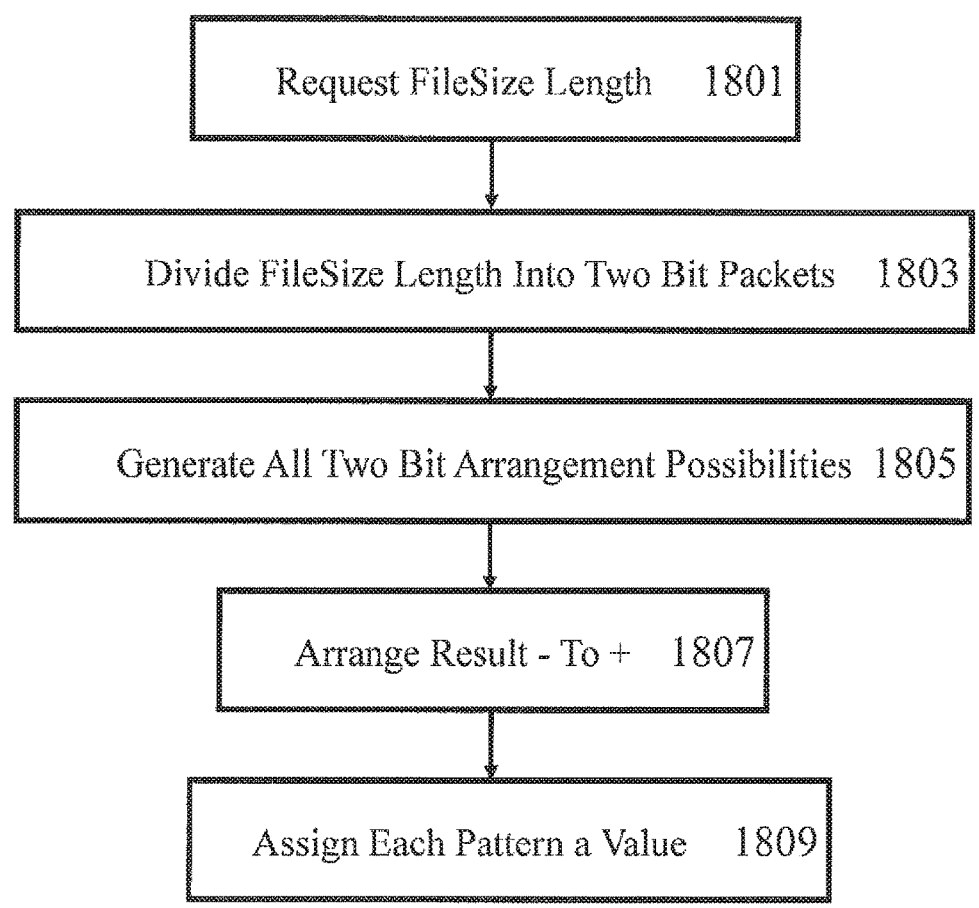
FIG. 18 depicts the generation of the compression key tables in accordance with an embodiment of the data compression component.
Figure 19:
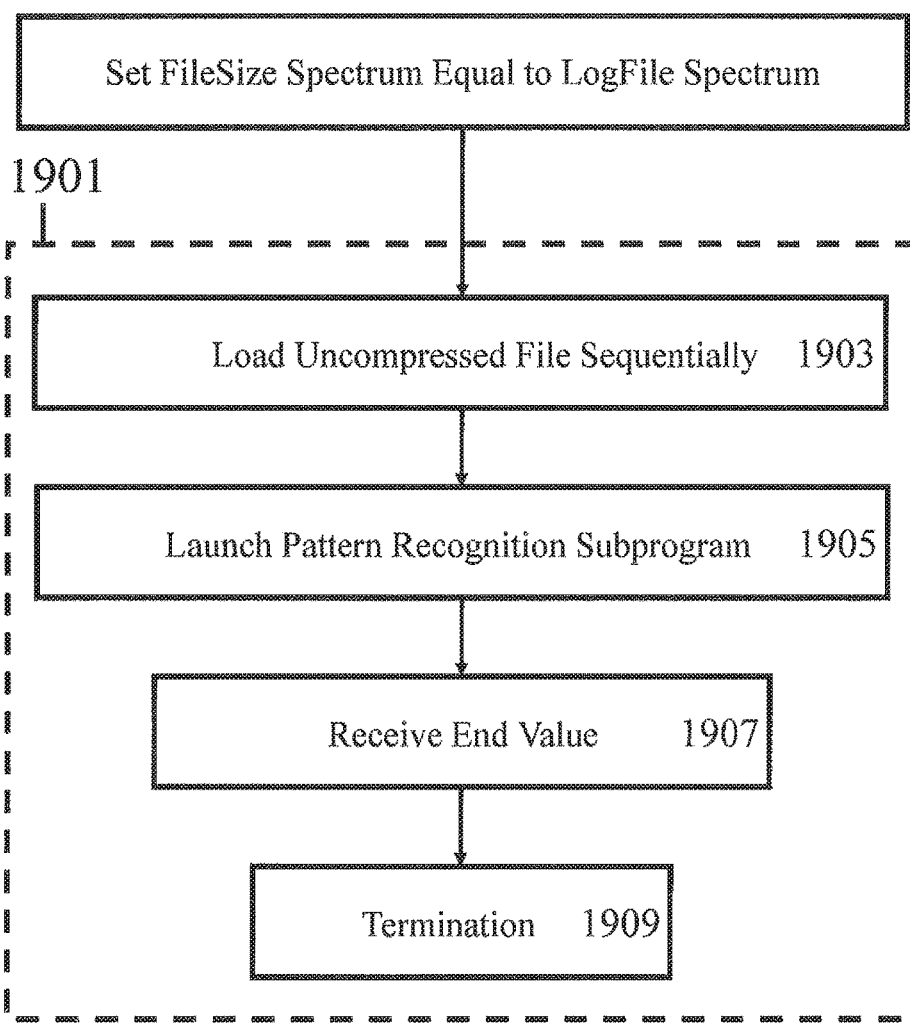
FIG. 19 shows the preferred process for running a compression key when a data file to be compressed or decompressed in accordance with an embodiment of the data compression component.

An alternate view of the compression key generation (which can also be seen as the lookup table generation) is shown in FIG. 18. For a File of a given FileSize, the length is first determined 1801 and a value (referred to also as the packet value) is assigned to stand for each two-bit packet for a given binary string 1803. From there, a binary spectrum is generated for all possible combinations of packet values for a file of a given FileSize. Preferably, the spectrum is then arranged from smallest to largest 1807 and this spectrum is assigned another value 1809. This value 1809 shall be referred to as the compression value and may also be referred to herein as the compression key or code 1809. This compression value may be attained by any predetermined convention, although preferred methods would result in the smallest number or value. For example, the operation of a formula or the sum or product of the packet values for a given line of binary code in the binary spectrum. For example, a one megabit sized file is broken into 500,000 two bit packets then that can be represented by a much smaller value. Another way of stating this is in terms of the on off flashes that are produced by an optical fiber to transmit data. In typical optical fibers, one wavelength of white light is used. The compression uses the probability that those light intensities were organized in that exact manner and assign a value in bits. This value will be much smaller, but still be transmittable by light flashes.

The tables (another term for the grids comprising the packaged binary arrangements and their assigned coefficients) may be pre-generated for a certain number of file sizes, or generated at runtime (of a compression or a decompression or both) and cached for later use. Note that the calling up and use of compression key tables (either pre-generated or generated at runtime) will not require undue resources of the machine; the compression key tables are self-generated, for example with self-replicating code, and preferably cached once run for outputting a different value to RAM for subsequent operations for various files of the same file size (but different binary arrangements). Also, one benefit to the tables being self-generated for files of all different file sizes, is that the data does not have to be set to a certain size prior to, for example, compression—the method will work for any file size.

FIG. 17 shows what is done when the data compression component receives data to be compressed 1701. This is preferably a real time generation of probability tables corresponding to a particular file size allowing then a CPU powered comparison of the data to the corresponding compression key. Once a data input is registered, per se, a program can compare it to a self-generated table to see the probability the binary is arranged in that certain way.

First there must be an input data, which is loaded 1703. The data is then compared with the appropriate compression key 1705. This comparison may be performed using a standard library for comparing the data with the appropriate compression key. The standard library may be built up in any language including but not limited to C++ or any tool in the Visual Studio pack, or any other language. Alternatively, a library in code can be an open source program available through the compiler and used widely. Compression keys to be used vary based on the input from a user as to the size of the data file to be compressed. Step 1707 refers to the replacement of the data with the compressed file. Finally, the data compression component may loop 609 in case there is a queue of additional files to be compressed, and if none, cancel and terminate.

FIG. 19 shows the running of the compression key which was generated at step 1205, 1901. First, the file is loaded and read 1903. The loading step is external to the compression (or parallel decompression) and may be loading to the processing unit from RAM to the output back to the RAM. Various loading times may differ, but would not add more time to the actual compression, for instance if a file originates from a floppy drive or other location. Next, a pattern recognition subprogram is launched 1905. This pattern recognition subprogram may be a single pattern recognition using a switch case (or other conditional statement) or linear algebra pattern recognition subprogram. This feature enables the system to identify the appropriate pattern of the binary to be compressed with the compression keys. If the compression key table already has an assigned value to the particular bit pattern, the value is assigned to the original file 1907, which may be with a switch statement. This step is the Receive End Value step, 1907, and is followed by a termination 1909.

FIG. 20 shows a sample compression key table, for a file size of eight bits and is provided for the purpose of illustration only. The spectrums for all eight bit possibilities are shown in abbreviated form for purpose of space saving. Column B represents the binary packaged in the preferable two bit arrangement. Column C depicts a coefficient assigned to each two bit packet according to a chosen protocol, for instance integers, or characters, and the recasting of the string. In FIG. 20 this shows an example convention assigning the numerals 1-4 to stand for the two bit patterns 11, 01, 10, and 11, respectively.

It should be noted that due to the size limitations, an exceedingly small FileSize was selected for purpose of depicting the two bit partitioning and assignment of values to the same to represent original code—the compression method is optimal at much larger FileSizes because the compression key coefficients are subject to operations for producing a much shorter number (representing the final compressed file) than the sample coefficients shown here. This is because, in the case of an extremely short file, as shown in FIG. 9, the coefficients assigned cannot be simplified to result in a compression key that has fewer bits than the original four bit file. (Moreover, compression is not an issue for such small files, as they are already "compressed").

For much larger files however, these two bit coefficients would stand for each two bit sequence in the original file and the string of coefficients subjected to any simple operation or equation in order to assemble the string of coefficients to produce a value which will have a shorter bit sequence than the original file. The convention used for assigning this value (called the compression value) may be any convention such as a mathematical function or operation applied to the coefficient string. An example of such an operation is addition of the coefficients in the string to produce one number, or multiplication of same to produce a number, matrix, matrix multiplication, or scalar multiplication of the string of coefficients. Variations are possible, such as "niching" a chosen function to be applied to the string of coefficients into multiple layers, by applying the function on top of another instance of the same function, which was applied to the original value. This will only affect compression time due to the fact that any of these functions will allow for the same 'value shrinking', but some will be more efficient in the computation and compression time depending on other factors, such as the length of the overall file.

The compression value itself may also be subject to a series of simplifications. The compression value may be also be a probability converted to integer form (for example 1/1,000,000,000 could be converted into a nine digit number). The compression value, whether it is generated on a first simplification of the coefficient string, or subsequent simplifications, is then transmitted as binary code. This resulting binary code is much shorter than the original code, thus the compression. For this reason, the method disclosed actually improves its compression ratio as the FileSize increases.

FIGS. 21 and 22 are provided as another illustration of the method. At an encoding device 1001 or decoding device 1003, or both, FIG. 21 shows that compression key tables may be pre-generated. First for any given file length, a listing of all binary possibilities is generated 2101. This may be repeated for any File Size 2103. For a given binary spectrum that was generated in step 2101, the data is partitioned into two-bit packets. Each packet is assigned a value 2107, and each packaged pattern is assigned a compression key 2109. The assigning of the compression key itself is discussed elsewhere and may be any operation on the string of packets for a given binary possibility for a given file size.

The steps in FIG. 21 may be performed prior to or at the time of compression or decompression or both. When data is fed into the data compression component 2201 (from input 1007), it is also partitioned into two bit partitions 2203. A pattern recognition subprogram is run to compare the packaged data with the compression key table that corresponds to files of the data's size 2205. The data is them replaced with its key 2207 and converted to binary for output 1009. Output may be transmitted through channel 1015 to decoding device 1003 at its input 1011. Likewise, the decoding device 1003 may similarly output the compressed file 1013 to another location.

Decompression: As mentioned previously, the data compression component may include a decoding device 1003 for decompressing a compressed file. Alternatively, the compression component may employ the transcoder 2501 for performing decoding, or another transcoder. Upon receipt of the compressed file by a decoding device 1003, the data compression component will read a compression header. The header file serves includes a log file, which is a record of how the data was compressed by the encoding device for the purpose of decoding/decompression; during decompression, the header will instruct the program to decode the compressed file such that the uncompressed data may be regenerated at the receiving location. The header includes a value "Logfile" which, for example is 500,000 if the original file to be compressed was a 1Mbit file. This Logfile number serves as a record that the original data had a file size of 1 Mbits. This allows the decoding device to launch the appropriate lookup table without having to "recalculate" all the possible lookup tables for files of all sizes. The corresponding compression key table may be generated at this time or, if previously generated, pulled from cache.

The data compression component described herein has been built and tested and used for the rapid transmission of compressed files of various file types. The data compression component represents a useful simplification of compression data compression components of the past, which are inherently data-centric and complex. While known lossless compression methods use complex algorithms to analyze and shrink translated data, the disclosed data compression component completely changes the data as seen by the machine. Because this data compression component simply compresses raw binary regardless of the characters that the binary stands for, it does not require complex review of the actual data file to eliminate redundancy. As a result, it is a more efficient data compression component. Furthermore, because the data compression component uses compression keys to regenerate the exact code upon decompression, it is a lossless compression scheme—yet has compression ratios that most resemble lossy compression ratios; the data compression component improves over lossless and lossy compression by maintaining the quality of lossless compression while keeping the compression ratio aspect of lossy compression. As explained above, this is preferably accomplished using two bit packaging, casting of a binary spectrum for each file size to create compression keys, and the simplification of the same into a value, and transmission of the value itself as a compressed binary bitstream. The data compression component may be used on data that is already compressed into a compressed binary. In that regard, the data compression component improves the traditional eight-bit binary system of data packaging for receipt and transmission, while at the same time is fully interoperable with existing systems/terminals which use binary.

Variations in the data compression component may be made by those skilled in the art and are contemplated and made part of this disclosure. Although it would require additional power, the compressed code may be subjected to additional rounds of compression via the same method. This is because the compression method only requires a binary string (including a binary string of a compressed file) to compress the given string. In addition, the system may be used to compress the binary strings generated if compressed files which are generated by other known compression systems. Also, partitions other than two-bit may be used. Two bit partitioning was chosen as the preferred partition of the data because it is most efficient (meaning the highest compression ratios are attained using two-bit partitioning), however other sized partitions may be used. Two bit breakups are used due to the efficiency of calculation at runtime. The compression program simply has to assign a coefficient to each package and 'assemble' them into a single value that will be physically transferred.

System Architecture

The system may also include only encoding device 1001 or decoding device 1003. Channel 1205, 1215 is depicted as bidirectional in an embodiment because the two may be on one integrated system, or decompressed data in an embodiment may be returned to its original representation by an encoding device, which may be encoding device 1001 or another encoding device with the same architecture as encoding device 1001. Communication channel 1005, 1015 includes any suitable data communication structure, such as optical cable or wireless transfer systems or both wireless and fiber channels in communication. Alternatively, the system comprises a terminal having both an encoding and decoding device 1001, 1003 in communication with at least one other terminal having an encoding and decoding device.

Figure 23:
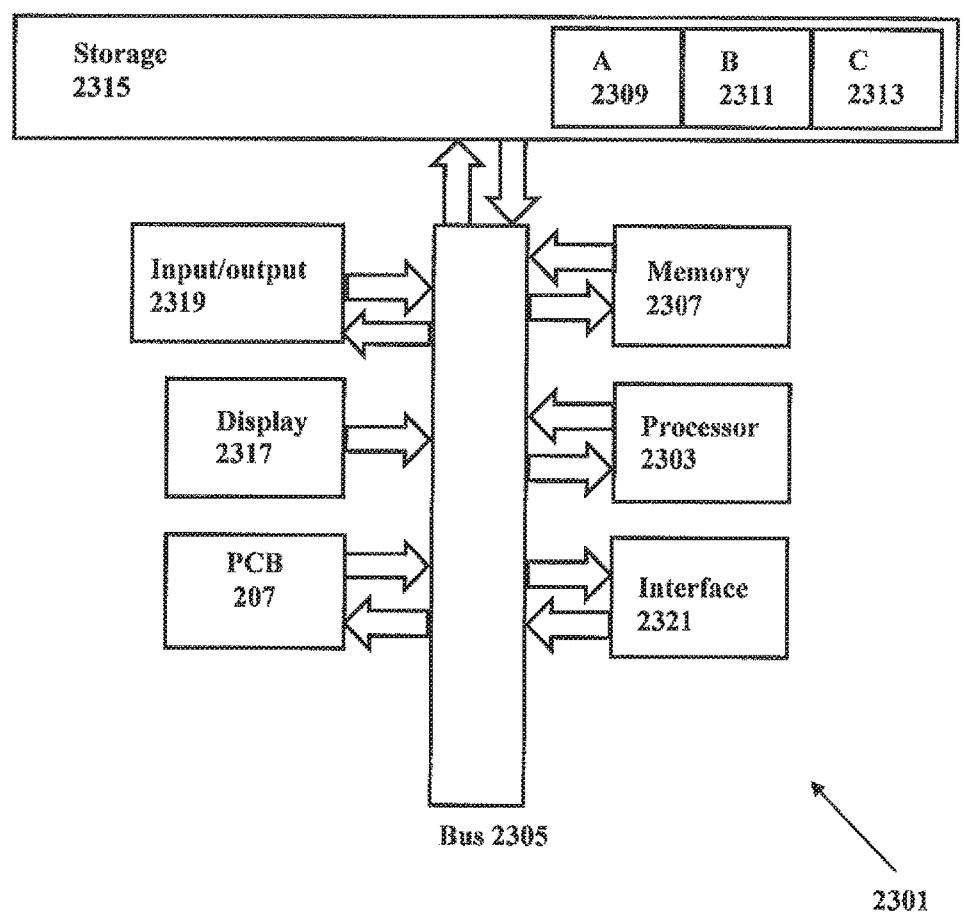
FIG. 23 shows the encoding device and the decoding device in communication in accordance with an embodiment of the data compression component.

A hardware embodiment of the system's encoding device 1001, decoding device 1003 or both is provided in FIG. 23. FIG. 23 depicts a hardware environment for performing one or more of the operations herein. These blocks or a subset of these blocks may be integrated into a device, such as a smartphone or tablet for performing the described methods. A computing device, which may be a network of computing devices, can be used to practice the embodiments described. As mentioned, the system preferably includes an encoding device 1003 and a decoding device 1005 in communication. The encoding device 1001 and decoding device 1003 may be combined or at separate terminals, the terminals each preferably having the componentry depicted in FIG. 23, for transmission of and receipt of data (which may be compressed). In one embodiment each of the encoding and decoding devices 1001, 1003 includes central processing unit (or processor) 2303 for executing the compression/decompression and RGB encoding/decoding, memory 2307, storage 2315, and input/output devices 2319, each of which are interconnected via a system bus 2305 that couples various system components including the memory to the processor. Modules can be configured to control the processor to process instructions for execution within the system. For instance, the system preferably comprises a chip including firmware (ex. Module A 2309) for performing the packaging of the binary code in accordance with the compression methods above. Such executed instructions can implement one or more components of the system, for example, the binary packaging step and the running of the compression key when handling incoming data to be compressed or decompressed. Alternatively, these steps may be performed by separate modules, such as Module B storing instructions for performing the decompression 2311, and Module C 2313 for storing pre-generated compression key tables for use in translating between compressed and decompressed/original data. Although not shown, additional modules may store instructions for encoding or decoding a binary string into RGB code and for instructing the frequency controller to convert same into electrical pulses to be emitted by the at least one antenna. In this Figure, PCB 207 is included and deemed to include at least all the components shown at 207 in FIG. 2.

Storage 2315 may be remote or local to the system. The processor is capable of processing instructions stored in memory or storage and may optionally display graphical information on an output device (such as the display 2317 of a user interface 2321 (whereby a user may interact with the system to select files to be compressed or transmitted), said output device preferably comprising output devices associated with a user device used by a user, such as a tablet or smartphone.

Memory 2307 may include multiple different types of memory with different performance characteristics and may be read only memory and random access memory. The disclosure may operate on a computing device with more than one processor or on a group of networked computing devices, servers, or a combination of both. The system can include clients and servers. A client and server are usually remote and interact via a communication network and programmed to interact in a client/server relationship.

Processor 2303 may include any general purpose processor and a hardware module or software modules stored in storage, configured to control the processor as well as a special-purpose processor where program instructions are incorporated into the actual processor design. ARM processors and standard smart-device processors are adequate to handle the compression and transmission methods, with approximately less than 2% stress on the CPU. The system may also comprise a smaller device processor as well, powered by a microcontroller. The processor may be a completely self-contained computing system, containing multiple cores or processors, a bus, memory controller, cache, etc. A multi-core processor may be symmetric or asymmetric. The preferred system embodiment is presented as including individual functional blocks including functional blocks labeled as a "processor" or processor. The functions of one or more processors may be provided by a single shared processor or multiple processors. (The term "processor" should not be construed to refer exclusively to hardware capable of executing software, and as used herein is also referred to as a "processing device.") Illustrative embodiments may include microprocessor and/or digital signal processor hardware, read only memory for storing software performing the operations discussed above, and random access memory for storing results.

Bus 2305 may be any of several types of bus structures including a memory bus or memory controller, a peripheral bus, and a local bus using any of a variety of bus architectures. A basic input/output (BIOS) stored in read only memory or the like, may provide the basic routine that to assist in the transfer of information between elements within the computing device, such as during start-up. The computing system further includes storage such as a hard disk drive, a magnetic disk drive, an optical disk drive, tape drive or the like. Storage can include software modules, for example, for controlling the processor 2303. Other hardware or software modules are contemplated. The storage device is connected to the bus by a drive interface. Input data to be compressed may be fed from the storage device having a plurality of memories connected to corresponding subprocessors. The drives and the associated computer-readable storage media provide nonvolatile storage of computer-readable instructions, data structures, program modules and other data for the computing device.

Input/Output 2319 may be a connection to a communication channel 1005, 1015, for the receipt and transmission of data, respectively. In this instance, antenna 213 may be located here. In the preferred embodiment, a file to be compressed is input into the system at input 2319, then compressed according to the instructions in, for example Module A 2309, such instructions executed by processor 2307. Module A 2309 is used as an example, however, modules for containing instructions for performing compression, decompression or both may be stored as a combination of one or more modules, for example Modules A-C 2309, 2311, 2313 (or more modules for storing instructions or libraries of instructions). In the preferred embodiment, following compression, the binary string corresponding to the compressed file's compression key is encoded into RGB code by the encoding device by way of instructions stored in Module B (for example) 2311 for instructing the processor to encode the binary string into RGB code. Module C maybe instructions for instructing the processor and frequency control 211 to convert the RGB code into electrical pulses to be emitted by an antenna.

In one embodiment, a hardware module that performs a particular function includes the software component stored in a non-transitory computer-readable medium in connection with the necessary hardware components, such as the processor, bus, display (optional), and so forth, to carry out the function. The system may include a user interface for allowing users to choose certain files to be compressed (not pictured), visible to a user via a display. As mentioned previously, the system may further comprise a display 2317 or interface 2321 or both whereby a user may interact with the system, for example, to select files to compress or transmit wirelessly or both. In embodiments including a display, "display" refers to visually perceptible display on a display device (such as a networked computing device for example, an end user's device) resulting from a tangible computer filed stored in its memory. This may originate from across a network, such as the Internet, a wireless communication network, or a system of connected networked computers. The display includes devices upon which information can be displayed in a manner perceptible to a user, such as a touchpad or touchscreen display, a computer monitor, an LED display, and the like means known in the art for producing visually perceptible output. The basic components are known to those with skill in the art and appropriate variations are contemplated depending on the type of device; the term "computing device" refers to any device, such as a user device, with processing capability such that it can execute instructions, for example, tablets, smartphones, PC computers, servers, telephones, and other similar devices.

To enable user interaction with the computing device, an interface 2321 represents any number of input mechanisms, such as a microphone for speech, a touchscreen for gesture or graphical input, keyboard, mouse, motion input, speech, etc. An output device can also be one or more of a number of output mechanisms known to those of skill in the art. In some instances, multimodal systems enable a user to provide multiple types of input to communicate with the computing device. The communications interface generally governs and manages the user input and system output. There is no restriction on operating on any particular hardware configuration and the basic componentry here may easily be substituted for improved hardware or firmware arrangements as they are developed.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system can practice all or part of the disclosed methods and/or can operate according to instructions in the recited non-transitory computer-readable storage media. Such logical operations can be implemented as modules configured to control the processor to perform particular functions according to the programming of the module. For example, modules controlling the processor to perform particular steps or a series of steps, however additional or fewer modules may be used. These modules may be stored on the storage and loaded into random access memory or memory at runtime or may be stored as would be known in the art in other computer-readable memory locations.

Portions of various embodiments of the present invention may be provided as a computer program product, which may include a computer-readable medium having stored thereon computer program instructions, which may be used to program a computer (or other electronic devices) to perform a process according to the embodiments of the present invention. The machine-readable medium may include, but is not limited to, floppy diskettes, optical disks, compact disk read-only memory (CD-ROM), and magneto-optical disks, ROM, RAM, erasable programmable read-only memory (EPROM), electrically EPROM (EEPROM), magnet or optical cards, flash memory, or other type of media/machine-readable medium suitable for storing electronic instructions. Although the exemplary embodiment described herein employs the hard disk, storage, those skilled in the art appreciate that other types of computer-readable media may also be used in the exemplary operating environment. Non-transitory computer-readable storage media expressly exclude media such as energy, carrier signals, electromagnetic waves, and signals per se.

Figure 24:
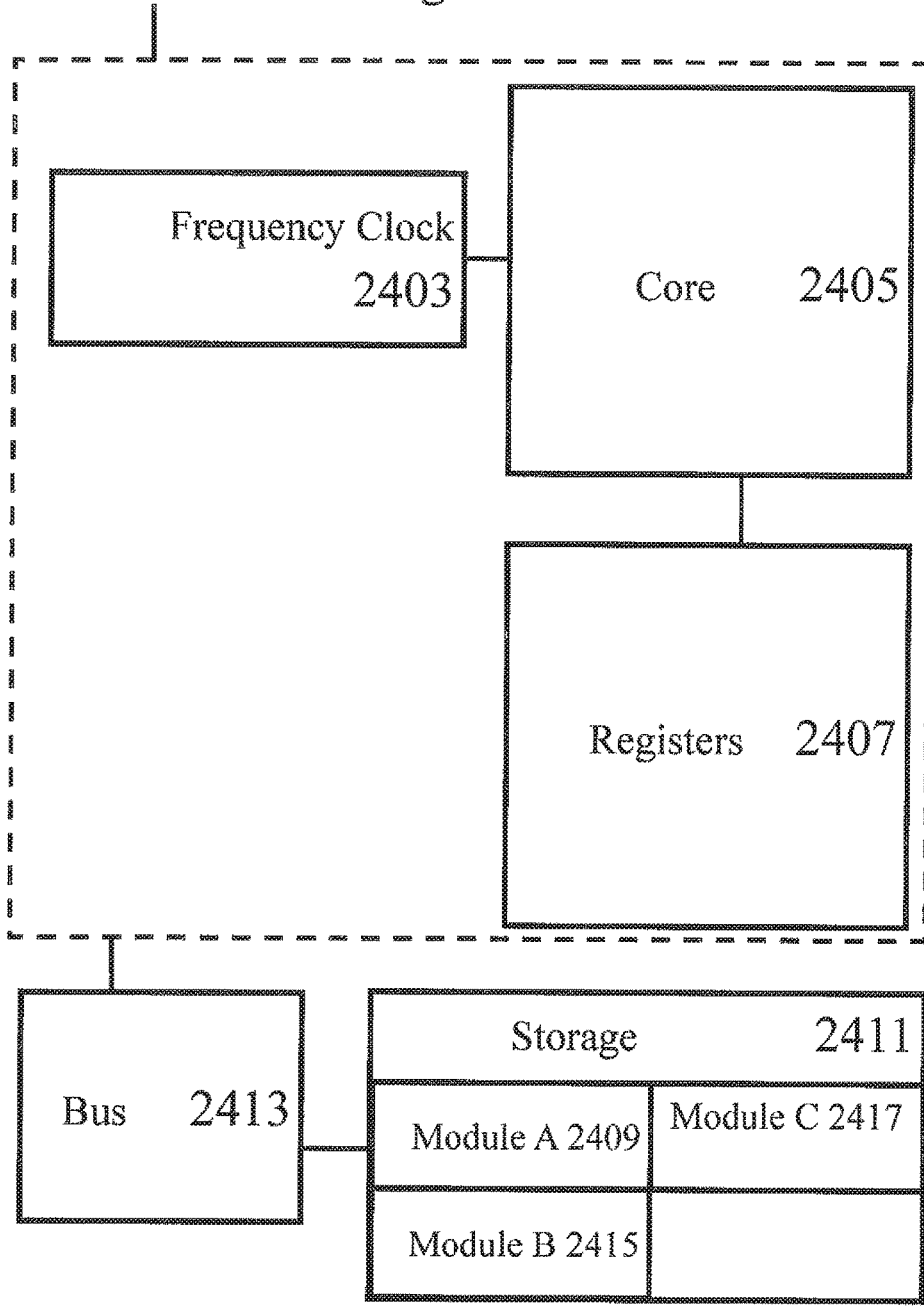
FIG. 24 shows an exemplar hardware architecture for the system in accordance with an embodiment of the data compression component.
Figure 25:
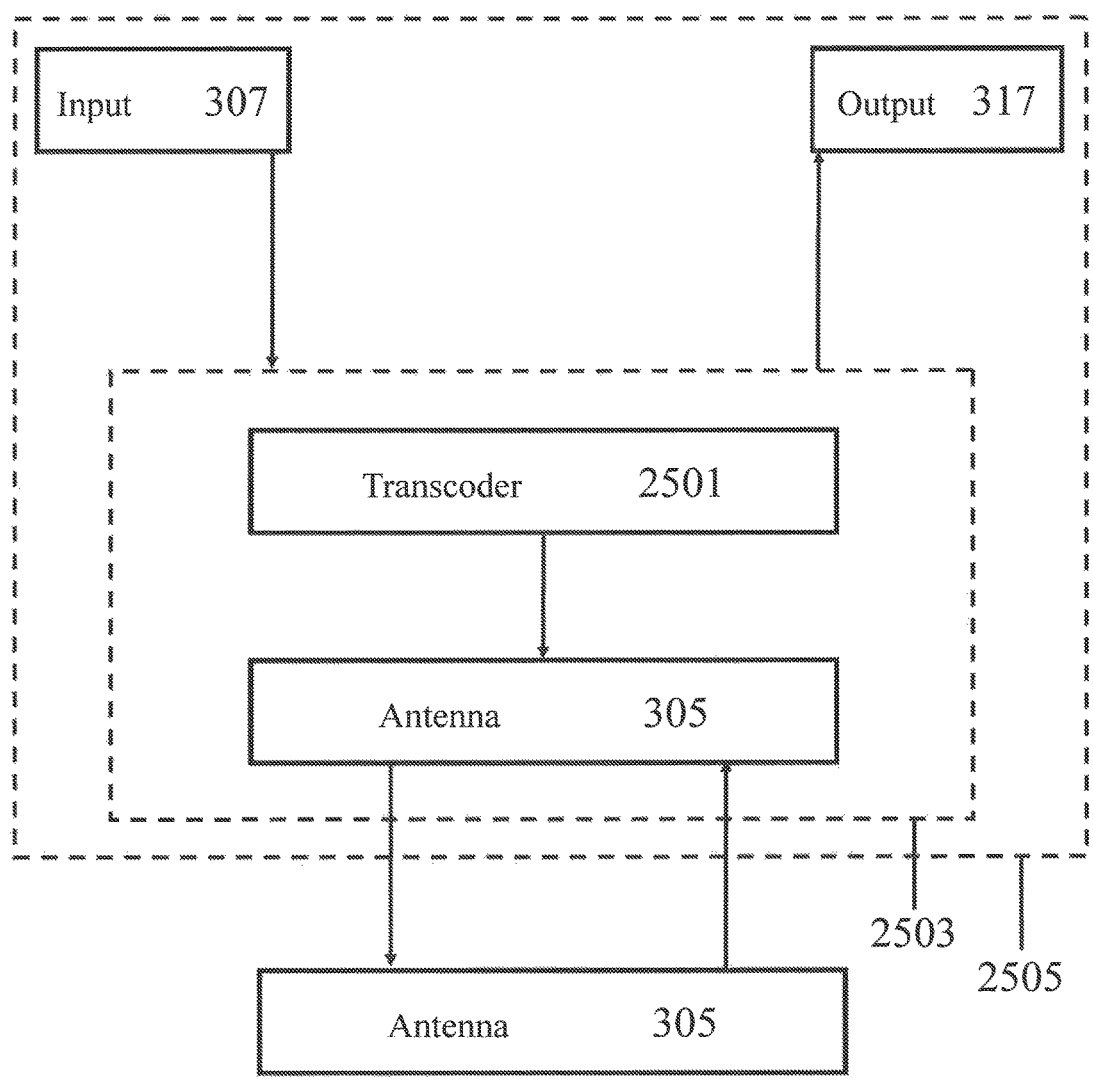
FIG. 25 shows an exemplar embodiment of the system.

FIG. 24 shows an embodiment of the system showing a detail view of PCB 207 coupled with a bus 2413 and storage 2411. This configuration may be coupled with other componentry as shown in FIG. 23. In the configuration shown in FIG. 24, PCB 207 further comprises a central processing unit capable of running preferably at least 700 MHz. (The processor also depicted in FIG. 23 at 2303). It further comprises at least a frequency clock 2403 and at least one core 2405 for processing (preferably at least 128 KB) coupled with at least one register 2407 capable of holding the data briefly prior to being sent to the frequency control 211, plus preferably a module containing program instructions (here as "Module A") 2409 for instructing the processor to perform the compression method of the data compression component, described elsewhere in this application, which program instructions may be loaded as firmware. "Module A" shown in FIG. 24 may be stored in read only memory/storage 2311 coupled to the PCB via bus 2413. In the Storage, Module B 2415, preferably comprises at least program instructions for the encoder to encode binary to RGB code are present. Module C 2417 is also present and may be program instructions for the decoder to decode RGB code to binary form. Other modules may be used or combined with existing modules, such as program instructions for the frequency controller firmware.

Variations

Variations in the above embodiments made by those skilled in the art of contemplated and made part of this disclosure. Because the technology uses variable frequencies to illustrate multiple bits, the system may employ apply multiple types of waves, for example, sound light or radio wave-basically anything with a variable energy still will work. For example seismic waves, although not practical. Another energy could be in current wavelengths using sine waves, square waves, or scalar waves.

Lookup tables employed may be one or a plurality of tables enabling the device to transmit on more than one range of bands. Therefore, the encoding and decoding devices may comprise more than one lookup table and instructions for instructing the frequency control to use a particular table for encoding the color codes as frequencies. The example of the Wi-Fi band was used, but the frequencies could be limited to the band used by Bluetooth devices (2.0 GHz to 2.5 GHz) or other bands.

Also, different color models may be used and assigned predetermined frequencies in alternate lookup tables. The system may also utilize the CMYK color model (Cyan Magenta Yellow and Key) which is commonly used in color printing, although this color model is not as precise as RGB. The use of the CMYK model would increase the file size to be transmitted, but still would work. Another variation is CcCmYK color model which is an extension of the CMYK which allows for more precision in the color model. These are just a few examples, there are other color models and corresponding sensors that could be used.

PCBs used may be adapted for mounting in laptops or smaller devices. Also, the frequency control 211, 311 is a microcontroller takes in RGB code that translates it into simple electrical pulses emitted and as such, may have an extra transistor for delivering extra power, and different firmware for controlling it to instruct the antenna.

The disclosed system may be incorporated into any wireless communicating terminal such as servers, cell towers or satellites, as well as routers, terminals (such as laptop computers), or tablets.

Also, the system may be architected with transceivers/transcoders as well as encoding devices and decoding devices and frequency controls, respectively. In one embodiment, the system may include at least a transcoder comprising a memory buffer for temporarily storing raw data before encoding, a memory cache for storing a transcoding instruction method. Alternatively, direct loading from the storage medium, which may consist of a hard disk drive (HDD), solid state drive (SSD), or other, can be used. Any method used to load the data from the storage medium to the transmission apparatus will suffice. The method may be for receiving any raw data, including data in binary or other forms. In this embodiment, the method comprises receiving the raw data as input, partitioning the raw data into substrings of predetermined length, assigning each substring to a corresponding predetermined frequency based upon a data set or first lookup table, and transmitting said frequency using a transceiver antenna. The embodiment may further include the data compression component described above in one embodiment. In the embodiment that includes the data compression component, the system (prior to transmittal), receives raw data as input, breaks (or "partitions") the raw data into subsets of predetermined length, compares and the raw data to a second lookup table (as distinguished from the lookup table used to encode). This second lookup table comprises all possible bit patterns for a file of the length of the raw data, wherein the possible bit patterns are partitioned in n-bit partitions, the n-bit partitions having a corresponding assigned value, the values of which are assembled by a given function so as to produce a code for each possible bit pattern. This code would then be handled by the transcoder. If the raw data was binary, the code produced is also binary, but of a shorter length than the original raw data. The "code" (which may also be referred to herein as the "compressed data") is then relayed to the transcoder, where it is partitioned and assigned a particular frequency as explained above. In this manner this embodiment involves two operations that work together to increase transmittal efficiency.

Another variation are embodiments that are adapted to send this compressed data to another terminal, where this second terminal decodes into the "code", but does not necessarily have to regenerate the original raw data immediately following receipt. For instance a user may wish to transmit a large amount of data to another terminal, but may not need to access the file until another time. When the user decides to access the file, the system can then decompress the code into the original raw data, which may then be output to an operating system and be accessed as usual.

What is claimed is:

1. A system comprising at least
a transcoder adapted for partitioning data into partitions, wherein, the transcoder assigns a unique predetermined frequency to each partition, the unique predetermined frequency based on each partition's given pattern;
at least one antenna of a transceiver, coupled with the transcoder, for emitting one or more of the predetermined frequencies through a medium; and
wherein the assignment of a unique predetermined frequency to each partition based on the partition's pattern is performed using a data set or lookup table.

2. The system as in claim 1,
wherein the at least one antenna is adapted for receiving the predetermined frequencies of the system of claim 1; and
wherein the transcoder is adapted for decoding each predetermined frequency into its corresponding partition.

3. The system of claim 1, further comprising a compression component, the compression component comprising at least
memory for storing instructions to implement a method for performing a data compression, a processor for performing said method,
the method comprising:
receiving raw data as input;
breaking the raw data into subsets of predetermined length;
comparing the raw data to a second lookup table, the second lookup table comprising:
all possible bit patterns for a data having the length of the raw data, wherein the possible bit patterns are partitioned in n-bit partitions, the n-bH partitions having a corresponding assigned value, the values of which are assembled by a given function so as to produce a code for each possible bit pattern.

4. The system as in claim 1 wherein the medium comprises a communication channel, the
communication channel further comprising a wireless network.

5. The system as in claim 1 wherein the assignment of a unique predetermined frequency
to each partition based on the partition's pattern is perfomled using a data set or lookup table.

6. The system as in claim 5, wherein the data set or lookup table is a color model.

7. A system comprising
at least a transceiver;
a transcoder coupled with the transceiver, the transcoder comprising:
memory for storing a transcoding instruction;
a processor for performing the transcoding instruction comprising the steps:
receiving raw data as input;
partitioning the raw data into substrings of predetermined length;
assigning each substring to a corresponding predetermined frequency based upon a data set or first lookup table; and
transmitting said frequency using an antenna of the transceiver; and
a compression component comprising at least a processor for performing a compression method, the method comprising:
receiving raw data as input;
breaking the raw data into subsets of predetermined length;
comparing the raw data to a second lookup table, the second lookup table comprising all possible bit patterns for a file of the length of the raw data, wherein the possible bit patterns are partitioned inn-bit partitions, then-bit partitions having a corresponding assigned value, the values of which are assembled by a given function so as to produce a code for each possible bit pattern.

8. The system of claim 7, wherein the compression method further comprises the step of replacing the raw data with the code, and wherein the system is adapted for transmitting the code to a second terminal.

9. The system as in claim 7, wherein the data set or first lookup table is a color model.

10. The system of claim 7, wherein the raw data and code are in binary format.

11. The system as in claim 8, further comprising the second terminal adapted to receive the code through a medium, the second terminal further comprising the compression component further adapted to perform a corresponding decompression.

12. The system as in claim 7 wherein the n-bit partitions are two-bit partitions.

13. The system as in claim 11 wherein the medium is a communication channel and the communication channel further comprises a wireless network.

14. The system of claim 7, further coupled with a system on a chip, microcontroller, or microchip.

* * * * *